US011462462B2

(12) United States Patent
Yoo et al.

(10) Patent No.: US 11,462,462 B2
(45) Date of Patent: Oct. 4, 2022

(54) SEMICONDUCTOR PACKAGES INCLUDING A RECESSED CONDUCTIVE POST

(71) Applicant: Samsung Electronics Co., Ltd., Suwon-si (KR)

(72) Inventors: Jaekyung Yoo, Seoul (KR); Jaeeun Lee, Suwon-si (KR); Yeongkwon Ko, Suwon-si (KR); Teakhoon Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 8 days.

(21) Appl. No.: 16/787,107

(22) Filed: Feb. 11, 2020

(65) Prior Publication Data

US 2021/0028098 A1    Jan. 28, 2021

(30) Foreign Application Priority Data

Jul. 22, 2019    (KR) .................. 10-2019-0088519

(51) Int. Cl.
*H01L 23/31* (2006.01)
*H01L 23/00* (2006.01)
(Continued)

(52) U.S. Cl.
CPC ...... *H01L 23/49822* (2013.01); *H01L 21/486* (2013.01); *H01L 21/4857* (2013.01); *H01L 21/563* (2013.01); *H01L 23/3114* (2013.01); *H01L 23/3121* (2013.01); *H01L 23/49811* (2013.01); *H01L 24/05* (2013.01); *H01L 25/18* (2013.01); *H01L 25/50* (2013.01)

(58) Field of Classification Search
CPC .......... H01L 23/49822; H01L 23/3114; H01L 23/3121; H01L 23/49811; H01L 21/4857; H01L 21/486
See application file for complete search history.

(56) References Cited

U.S. PATENT DOCUMENTS 5,834,850 A * 11/1998 Hotta .................... H01L 23/585
257/788
9,368,438 B2    6/2016 Lin et al.
(Continued)

FOREIGN PATENT DOCUMENTS

KR    101550197    9/2015

*Primary Examiner* — Stephen M Bradley
*Assistant Examiner* — Gustavo G Ramallo
(74) *Attorney, Agent, or Firm* — Myers Bigel, P.A.

(57) ABSTRACT

Semiconductor packages may include a semiconductor chip including a chip pad and a lower redistribution that includes a lower redistribution insulating layer and a lower redistribution pattern. The lower redistribution insulating layer may include a top surface facing the semiconductor chip. The semiconductor packages may also include a molding layer on a side of the semiconductor chip and including a bottom surface facing the lower redistribution structure and a conductive post in the molding layer. The conductive post may include a bottom surface contacting the lower redistribution. The top surface of the lower redistribution insulating layer may be closer to a top surface of the conductive post than a top surface of the molding layer. A roughness of the top surface of the molding layer may be greater than a roughness of the top surface of the conductive post.

19 Claims, 26 Drawing Sheets

(51) Int. Cl.
*H01L 23/498* (2006.01)
*H01L 21/56* (2006.01)
*H01L 25/18* (2006.01)
*H01L 21/48* (2006.01)
*H01L 25/00* (2006.01)

(56) References Cited

U.S. PATENT DOCUMENTS

| | | |
|---|---|---|
| 9,572,256 B2 | 2/2017 | Yoshikawa et al. |
| 9,620,430 B2 | 4/2017 | Lu et al. |
| 9,627,303 B2 | 4/2017 | Zhang et al. |
| 9,646,921 B2 | 5/2017 | Chiang et al. |
| 10,504,826 B1* | 12/2019 | Fillion .................. H01L 24/73 |
| 2009/0061564 A1* | 3/2009 | Lytle .................. H01L 23/3114 |
| | | 438/113 |
| 2013/0119549 A1* | 5/2013 | Cheng .............. H01L 23/49816 |
| | | 257/772 |
| 2013/0200528 A1* | 8/2013 | Lin .................... H01L 23/3157 |
| | | 257/774 |
| 2013/0270685 A1* | 10/2013 | Yim ...................... H01L 25/105 |
| | | 257/686 |
| 2015/0008586 A1* | 1/2015 | Tsai ...................... H01L 21/486 |
| | | 257/774 |
| 2015/0187722 A1* | 7/2015 | Chiang ............. H01L 23/49816 |
| | | 257/737 |
| 2016/0351543 A1* | 12/2016 | Ryu .................... H01L 25/0657 |
| 2017/0032977 A1* | 2/2017 | Chen .................... H01L 21/568 |
| 2018/0041003 A1 | 2/2018 | Dominguez et al. |
| 2019/0006314 A1* | 1/2019 | Jeng ................... H01L 23/5389 |
| 2019/0304862 A1* | 10/2019 | Lu ......................... H01L 25/50 |

* cited by examiner

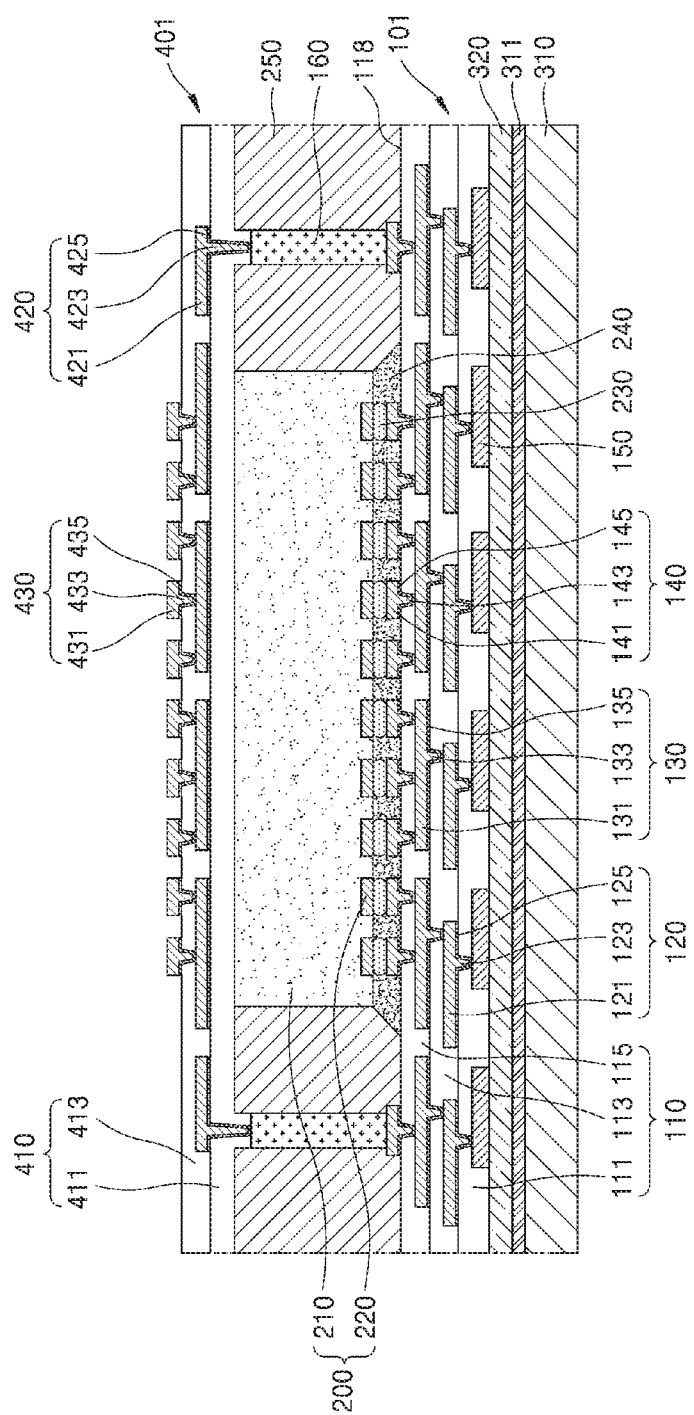

SEMICONDUCTOR PACKAGES INCLUDING A RECESSED CONDUCTIVE POST

CROSS-REFERENCE TO RELATED APPLICATION

This application claims priority under 35 U.S.C. § 119 to Korean Patent Application No. 10-2019-0088519, filed on Jul. 22, 2019, in the Korean Intellectual Property Office, the disclosure of which is incorporated herein in its entirety by reference.

BACKGROUND

The inventive concept relates to semiconductor packages and methods of manufacturing the same, and more particularly, to fan-out semiconductor packages and methods of manufacturing the same.

With the rapid increase in demand for portable devices in the recent electronic products market, electronic components mounted on electronic products have continuously been desired to be compact and light. To make electronic components compact and light, a semiconductor package mounted on the electronic components may be small and may process a large amount of data. In particular, in a highly-integrated semiconductor chip having an increased number of input/output (I/O) terminals, the distance between I/O terminals may decrease, and accordingly, interference may occur between the I/O terminals. To reduce the interference between I/O terminals, a fan-out semiconductor package enabling the distance between I/O terminals to increase may be used.

SUMMARY

The inventive concept provides semiconductor packages having increased reliability and methods of manufacturing the same.

According to some embodiments of the inventive concept, there are provided semiconductor packages that may include a semiconductor chip including a chip pad and a lower redistribution structure on the semiconductor chip. The lower redistribution structure may include a lower redistribution insulating layer and a lower redistribution pattern that is electrically connected to the chip pad of the semiconductor chip, and the lower redistribution insulating layer may include a top surface facing the semiconductor chip. The semiconductor packages may also include a molding layer extending on a side of the semiconductor chip and including a bottom surface facing the lower redistribution structure and a top surface opposite to the bottom surface of the molding layer and a conductive post in the molding layer. The conductive post may include a bottom surface contacting the lower redistribution pattern and a top surface opposite to the bottom surface of the conductive post. The top surface of the conductive post may be spaced apart from the top surface of the lower redistribution insulating layer by a first distance, and the top surface of the molding layer may be spaced apart from the top surface of the lower redistribution insulating layer by a second distance that may be greater than the first distance. A roughness of the top surface of the molding layer may be greater than a roughness of the top surface of the conductive post.

According to some embodiments of the inventive concept, there are provided semiconductor packages that may include a lower redistribution structure including a lower redistribution insulating layer and a lower redistribution pattern, a lower semiconductor chip on the lower redistribution insulating layer and electrically connected to the lower redistribution pattern, and a conductive post on the lower redistribution insulating layer and electrically connected to the lower redistribution pattern. The lower redistribution insulating layer may include a top surface facing the lower semiconductor chip and the conductive post, and the conductive post may include a bottom surface facing the lower redistribution structure and a top surface opposite to the bottom surface of the conductive post. The semiconductor packages may also include a molding layer extending on a side surface of the lower semiconductor chip and a side surface of the conductive post and including a bottom surface facing the lower redistribution structure and a top surface that is opposite to the bottom surface of the molding layer. The top surface of the conductive post may be spaced apart from the top surface of the lower redistribution insulating layer by a first distance, and the top surface of the molding layer may be spaced apart from the top surface of the lower redistribution insulating layer by a second distance that may be greater than the first distance. The semiconductor packages may further include an upper redistribution structure on the molding layer and the lower semiconductor chip. The upper redistribution structure may include an upper redistribution insulating layer and an upper redistribution pattern, the upper redistribution insulating layer may extend on the top surface of the conductive post, and the upper redistribution pattern may extend through a portion of the upper redistribution insulating layer and contacting the conductive post. A roughness of the top surface of the molding layer may be greater than a roughness of the top surface of the conductive post.

According to a some embodiments of the inventive concept, there are provided semiconductor packages that may include a lower package including a lower semiconductor chip, a molding layer extending on a side surface of the lower semiconductor chip, a conductive post in the molding layer, and a lower redistribution pattern electrically connecting the lower semiconductor chip to the conductive post. The semiconductor packages may also include an upper package on the lower package, and the upper package may include an upper semiconductor chip. The conductive post may include a top surface facing the upper package. The semiconductor packages may further include an interpackage connector between the lower package and the upper package, and the interpackage connector may contact the top surface of the conductive post. The molding layer may include a top surface facing the upper package, and the top surface of the conductive post may be recessed toward the lower redistribution pattern with respect to the top surface of the molding layer. A roughness of the top surface of the molding layer may be greater than a roughness of the top surface of the conductive post.

According to some embodiments of the inventive concept, there are provided methods of manufacturing a semiconductor package. The methods may include forming a lower redistribution structure including a lower redistribution insulating layer and a lower redistribution pattern, and forming a conductive post on a portion of the lower redistribution pattern. The conductive post may include a bottom surface facing the lower redistribution structure and a top surface opposite to the bottom surface of the conductive post. The methods may also include forming a sacrificial layer on the top surface of the conductive post, providing a semiconductor chip on the lower redistribution structure, forming a molding layer on the semiconductor chip, the conductive post, and the sacrificial layer, removing a portion of the molding layer and exposing the sacrificial layer by performing a polishing process, and exposing the top surface of the conductive post by removing the sacrificial layer.

BRIEF DESCRIPTION OF THE DRAWINGS

Embodiments of the inventive concept will be more clearly understood from the following detailed description taken in conjunction with the accompanying drawings in which:

FIGS. 8A, 8B, 8C, 8D, 8E, 8F, 8G, 8H, 8I, 8J, 8K, 8L, 8M, 8N, 8O, 8P, 8Q, 8R, and 8S are cross-sectional views of sequential stages in a method of manufacturing a semiconductor package according to example embodiments of the inventive concept.

DETAILED DESCRIPTION

Figure 1:
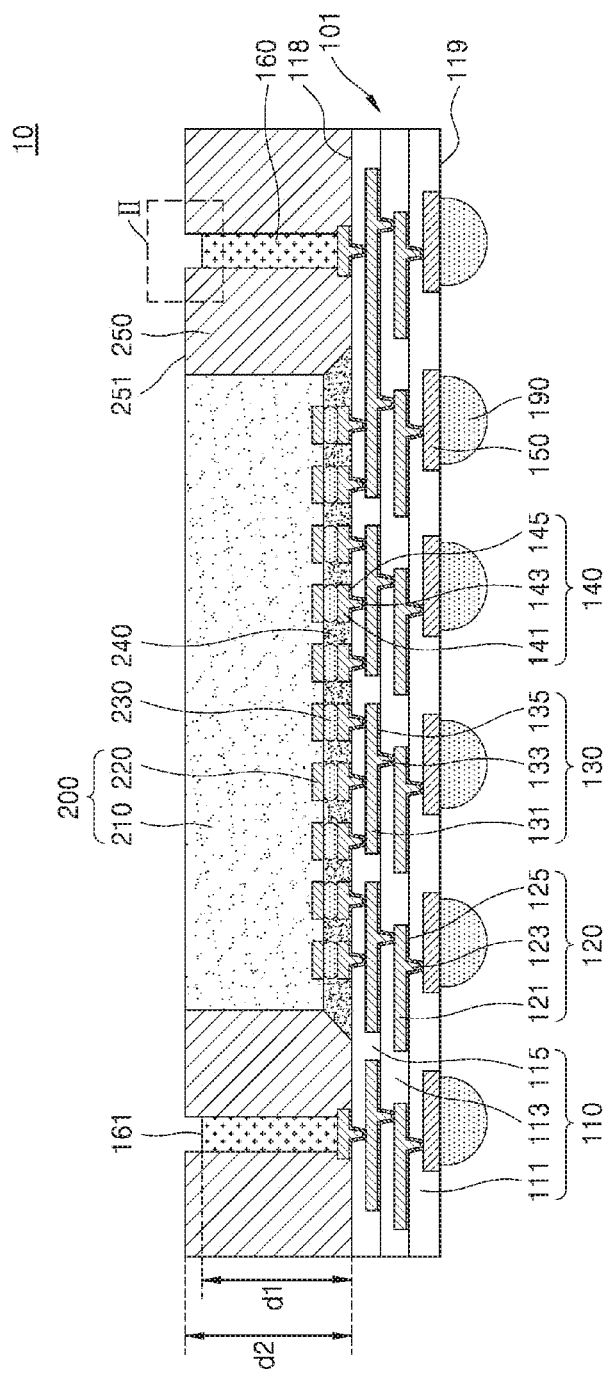
FIG. 1 is a cross-sectional view of a semiconductor package according to example embodiments of the inventive concept.

Hereinafter, example embodiments will be described with reference to the accompanying drawings. In the drawings, like numerals denote like elements and redundant descriptions thereof may be omitted.

Figure 2:
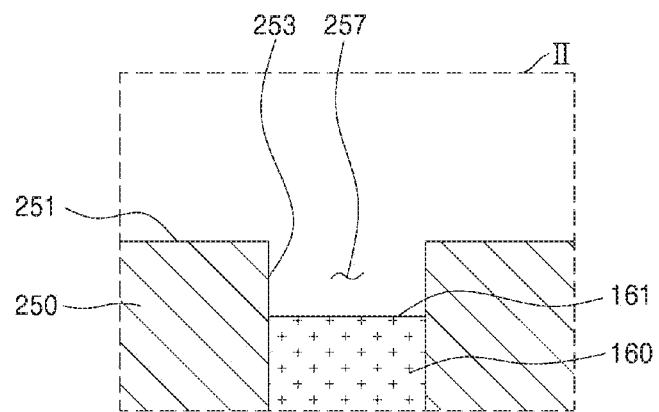
FIG. 2 is an enlarged cross-sectional view of a region II in FIG. 1.

FIG. 1 is a cross-sectional view of a semiconductor package 10 according to example embodiments of the inventive concept. FIG. 2 is an enlarged cross-sectional view of a region II in FIG. 1.

Referring to FIGS. 1 and 2, the semiconductor package 10 may include a redistribution structure 101, a semiconductor chip 200, a conductive post 160, and a molding layer 250.

The redistribution structure 101 may include a redistribution insulating layer 110, a plurality of redistribution patterns, e.g., first, second, and third redistribution patterns 120, 130, and 140, and an external electrode pad 150.

The redistribution insulating layer 110 may include a plurality of insulating layers, e.g., first, second, and third insulating layers 111, 113, and 115. The first through third insulating layers 111, 113, and 115 may be formed from, for example, a material film including an organic compound. In example embodiments, the first through third insulating layers 111, 113, and 115 may be formed from a material layer including an organic polymer material. In example embodiments, the first through third insulating layers 111, 113, and 115 may include a photo-imageable dielectric (PID) material enabling a photo lithography process. For example, the first through third insulating layers 111, 113, and 115 may include photosensitive polyimide (PSPI). In example embodiments, the first through third insulating layers 111, 113, and 115 may include oxide or nitride. For example, the first through third insulating layers 111, 113, and 115 may include silicon oxide or silicon nitride.

The first through third redistribution patterns 120, 130, and 140 may include first, second, and third conductive line patterns 121, 131, and 141, respectively, and first, second, and third conductive via patterns 123, 133, and 143, respectively. Each of the first through third conductive line patterns 121, 131, and 141 may be on at least one selected from a top surface and a bottom surface of a corresponding one of the first through third insulating layers 111, 113, and 115. The first through third conductive via patterns 123, 133, and 143 may penetrate through at least one selected from the first through third insulating layers 111, 113, and 115. The first through third conductive via patterns 123, 133, and 143 may be connected to at least one selected from the first through third conductive line patterns 121, 131, and 141 or to the external electrode pad 150. "An element A being connected to an element B" (or similar language) as used herein may mean that the element A is electrically and/or physically connected to the element B. In some embodiments, the first conductive line pattern 121 may extend on a surface of the first insulating layer 111, and the first conductive via pattern 123 may be connected to both the first conductive line pattern 121 and the external electrode pad 150 as illustrated in FIG. 1. In some embodiments, the second conductive line pattern 131 may extend on a surface of the second insulating layer 113, and the second conductive via pattern 133 may be connected to both the second conductive line pattern 131 and the first conductive line pattern 121 as illustrated in FIG. 1. In some embodiments, the third conductive line pattern 141 may extend on a surface of the third insulating layer 115, and the third conductive via pattern 143 may be connected to both the third conductive line pattern 141 and the second conductive line pattern 131 as illustrated in FIG. 1.

A plurality of seed layers, e.g., first, second, and third seed layers 125, 135, and 145, may be respectively arranged between the first through third insulating layers 111, 113, and 115 and the first through third conductive line patterns 121, 131, and 141 and respectively arranged between the first through third insulating layers 111, 113, and 115 and the first through third conductive via patterns 123, 133, and 143. In example embodiments, the first through third seed layers 125, 135, and 145 may be formed using physical vapor deposition and the first through third conductive line patterns 121, 131, and 141 and the first through third conductive via patterns 123, 133, and 143 may be formed using electroless plating.

For example, the first through third seed layers 125, 135, and 145 may be selected from a group of copper (Cu), titanium (Ti), titanium tungsten (TiW), titanium nitride (TiN), tantalum (Ta), tantalum nitride (TaN), chromium (Cr), aluminum (Al), and so on. However, the first through third seed layers 125, 135, and 145 are not limited to the above materials. In example embodiments, the first through third seed layers 125, 135, and 145 may include Cu/Ti, in which Cu is stacked on Ti, or Cu/TiW, in which Cu is stacked on TiW.

The first through third conductive line patterns 121, 131, and 141 and the first through third conductive via patterns 123, 133, and 143 may include a metal, such as Cu, Al, W, Ti, Ta, indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof but are not limited thereto. In example embodiments, when Cu is used for the first through third conductive line patterns 121, 131, and 141 and the first through third conductive via patterns 123, 133, and 143, at least a portion of the first through third seed layers 125, 135, and 145 may act as a diffusion barrier.

The external electrode pad 150 may be arranged on a bottom surface of the redistribution structure 101. An external connector 190 may be arranged on the external electrode pad 150. The semiconductor package 10 may be electrically connected to and mounted on a module substrate or a system board of an electronic product through the external connector 190. The external electrode pad 150 may function as under bump metallurgy (UBM) on which the external connector 190 is arranged.

In example embodiments, the external electrode pad 150 may have a uniform thickness overall. A bottom surface of the external electrode pad 150, on which the external connector 190 is arranged, may be flat. For example, the external electrode pad 150 may include a metal, such as Cu, Al, W, Ti, Ta, In, Mo, Mn, Co, Sn, Ni, Mg, Re, Be, Ga, or Ru, or an alloy thereof but are not limited thereto. In some embodiments, the bottom surface of the external electrode pad 150 may directly contact the external connector 190, and a distance between a top surface and the bottom surface of the external electrode pad 150 may be uniform as illustrated in FIG. 1.

The configuration of the redistribution structure 101 will be described in detail below.

The redistribution insulating layer 110 may include the first insulating layer 111, the second insulating layer 113, and the third insulating layer 115, which are sequentially stacked. The first redistribution pattern 120 may include the first conductive line pattern 121, the first conductive via pattern 123, and the first seed layer 125. The second redistribution pattern 130 may include the second conductive line pattern 131, the second conductive via pattern 133, and the second seed layer 135. The third redistribution pattern 140 may include the third conductive line pattern 141, the third conductive via pattern 143, and the third seed layer 145.

The first insulating layer 111 may include a first via opening (VO1 in FIG. 8E) exposing a portion of the external electrode pad 150. The first seed layer 125 may be arranged on a portion of a top surface of the first insulating layer 111, the inner wall of the first via opening VO1, and a portion of a top surface of the external electrode pad 150, which is exposed through the first via opening VO1. A portion of the first seed layer 125 may be between the first conductive line pattern 121 and the top surface of the first insulating layer 111. Another portion of the first seed layer 125 may be arranged between the first conductive via pattern 123 and the external electrode pad 150 and surround the side wall of the first conductive via pattern 123. "An element A surrounding a side of an element B" (or similar language) as used herein may mean that the element A extends on the side of the element B but does not necessarily mean that the element A completely surrounds the side of the element B.

The first conductive line pattern 121 and the first conductive via pattern 123 may be arranged on the first seed layer 125. The first conductive line pattern 121 and the first conductive via pattern 123 may be integrally formed together using a plating process. The first conductive line pattern 121 may be arranged on the first conductive via pattern 123 and a portion of the first seed layer 125 on the top surface of the first insulating layer 111. The first conductive via pattern 123 may cover a portion of the first seed layer 125 in the first via opening VO1 and fill the first via opening VO1. The first conductive via pattern 123 may extend in a vertical direction, may extend through the first insulating layer 111, and may be connected to the first conductive line pattern 121 and the external electrode pad 150. "An element A covering an element B" (or similar language) as used herein may mean that the element A extends on the element B but does not necessarily mean that the element A covers the element B entirely. "An element A filling an element B" (or similar language) as used herein may mean that the element A is in the element B but does not necessarily mean that the element A completely fills the element B. "An element A and an element B being integrally formed together using a process C" (or similar language) as used herein may mean that the element A and the element B are formed using a single process C and may form a monolithic layer. The vertical direction may be a direction in which the first conductive line patterns 121 and the second conductive line patterns 131 are spaced apart from each other.

In example embodiments, the first conductive via pattern 123 may have a shape, of which the width in a horizontal direction decreases in a direction from a first surface 118 of the redistribution insulating layer 110 toward a second surface 119 thereof (or in a direction away from the semiconductor chip 200). In some embodiments, the first conductive via patterns 123 may have a width tapered toward the external electrode pad 150 as illustrated in FIG. 1. The first surface 118 of the redistribution insulating layer 110 may be a top surface of the redistribution insulating layer 110, and the second surface 119 may be a bottom surface that is opposite to the top surface of the redistribution insulating layer 110.

The second insulating layer 113, which covers a portion of the first conductive line pattern 121 and has a second via opening (VO2 in FIG. 8E) exposing the other portion of the first conductive line pattern 121, may be stacked on the first insulating layer 111.

The second seed layer 135 may be arranged on a portion of a top surface of the second insulating layer 113, the inner wall of the second via opening VO2, and a portion of a top surface of the first conductive line pattern 121, which is exposed through the second via opening VO2. A portion of the second seed layer 135 may be between the second conductive line pattern 131 and the top surface of the second insulating layer 113. Another portion of the second seed layer 135 may be arranged between the second conductive via pattern 133 and the first conductive line pattern 121 and surround the side wall of the second conductive via pattern 133.

The second conductive via pattern 133 and the second conductive line pattern 131 may be arranged on the second seed layer 135. The second conductive via pattern 133 and the second conductive line pattern 131 may be integrally formed together using a plating process. The second conductive line pattern 131 may be arranged on the second conductive via pattern 133 and a portion of the second seed layer 135 on the top surface of the second insulating layer 113. The second conductive via pattern 133 may cover a portion of the second seed layer 135 in the second via opening VO2 and fill the second via opening VO2. The second conductive via pattern 133 may extend in the vertical direction, may extend through the second insulating layer 113, and may be connected to the second conductive line pattern 131 and the first conductive line pattern 121.

In example embodiments, the second conductive via pattern 133 may have a shape, of which the width in the horizontal direction decreases in the direction from the first surface 118 of the redistribution insulating layer 110 toward the second surface 119 thereof. In some embodiments, the second conductive via pattern 133 may have a width tapered toward the first conductive line pattern 121 as illustrated in FIG. 1.

The third insulating layer 115, which covers a portion of the second conductive line pattern 131 and has a third via opening (VO3 in FIG. 8E) exposing the other portion of the second conductive line pattern 131, may be stacked on the second insulating layer 113.

The third seed layer 145 may be arranged on a portion of a top surface of the third insulating layer 115, the inner wall of the third via opening VO3, and a portion of a top surface of the second conductive line pattern 131, which is exposed through the third via opening VO3. A portion of the third seed layer 145 may be between the third conductive line pattern 141 and the top surface of the third insulating layer 115. Another portion of the third seed layer 145 may be arranged between the third conductive via pattern 143 and the second conductive line pattern 131 and surround the side wall of the third conductive via pattern 143.

The third conductive via pattern 143 and the third conductive line pattern 141 may be arranged on the third seed layer 145. The third conductive via pattern 143 and the third conductive line pattern 141 may be integrally formed together using a plating process. The third conductive line pattern 141 may be arranged on the third conductive via pattern 143 and a portion of the third seed layer 145 on the top surface of the third insulating layer 115. The third conductive via pattern 143 may cover a portion of the third seed layer 145 in the third via opening VO3 and fill the third via opening VO3. The third conductive via pattern 143 may extend in the vertical direction, may extend through the third insulating layer 115, and may be connected to the third conductive line pattern 141 and the second conductive line pattern 131.

In example embodiments, the third conductive via pattern 143 may have a shape, of which the width in the horizontal direction decreases in the direction from the first surface 118 of the redistribution insulating layer 110 toward the second surface 119 thereof. In some embodiments, the third conductive via pattern 143 may have a width tapered toward the second conductive line pattern 131 as illustrated in FIG. 1.

A portion of the third conductive line pattern 141 of the third redistribution pattern 140 may be arranged below the semiconductor chip 200 and may function as a pad, to which a chip connector 230 is attached. In addition, another portion of the third conductive line pattern 141 of the third redistribution pattern 140 may be spaced apart from a side surface of the semiconductor chip 200 in the horizontal direction and may function as a pad, to which the conductive post 160 is attached.

Although the redistribution structure 101 is illustrated to include three insulating layers, that is, the first through third insulating layers 111, 113, and 115, three conductive line patterns, that is, the first through third conductive line patterns 121, 131, and 141, and three conductive via patterns, that is, the first through third conductive via patterns 123, 133, and 143 in FIG. 1, embodiments of the inventive concept are not limited thereto. The numbers of insulating layers, conductive line patterns, and conductive via patterns may vary with the design of circuit wiring in the redistribution structure 101.

The semiconductor chip 200 may be attached to the redistribution structure 101. For example, the semiconductor chip 200 may be mounted on the redistribution structure 101 in a flip-chip manner.

The semiconductor chip 200 may include a memory chip or a logic chip. The memory chip may include, for example, a volatile memory chip such as dynamic random access memory (DRAM) or static RAM (SRAM) or a non-volatile memory chip such as phase-change RAM (PRAM), magnetoresistive RAM (MRAM), ferroelectric RAM (FeRAM), or resistive RAM (RRAM). In some embodiments, the memory chip may include a high bandwidth memory (HBM) DRAM semiconductor chip. The logic chip may include, for example, a micro processor, an analog device, or a digital signal processor.

The semiconductor chip 200 may include a semiconductor substrate 210 and a chip pad 220 in a surface of the semiconductor substrate 210.

The semiconductor substrate 210 may include, for example, silicon (Si). The semiconductor substrate 210 may include a semiconductor element, e.g., germanium (Ge), or a compound semiconductor such as silicon carbide (SiC), gallium arsenide (GaAs), indium arsenide (InAs), or indium phosphide (InP). The semiconductor substrate 210 may have an active side and an inactive side opposite to the active side. In example embodiments, the active side of the semiconductor substrate 210 may face the redistribution structure 101.

A semiconductor device including various kinds of individual devices may be formed in the active side of the semiconductor substrate 210 of the semiconductor chip 200.

The chip connector 230 may be arranged between the chip pad 220 of the semiconductor chip 200 and the third conductive line pattern 141. The chip connector 230 may electrically connect the chip pad 220 of the semiconductor chip 200 to the third conductive line pattern 141. The chip connector 230 may include, for example, at least one selected from a pillar structure, a solder bump, a solder ball, and a solder layer.

The semiconductor chip 200 may receive at least one selected from a control signal, a power signal, and a ground signal for the operation of the semiconductor chip 200 or a data signal to be stored in the semiconductor chip 200 from outside the semiconductor package 10 or provide data stored in the semiconductor chip 200 to outside the semiconductor package 10 through the chip connector 230, the first through third redistribution patterns 120, 130, and 140, the external electrode pad 150, and the external connector 190.

An underfill material layer 240 may be arranged between the semiconductor chip 200 and the redistribution structure 101 to surround the chip connector 230. The underfill material layer 240 may include, for example, epoxy resin formed using a capillary underfill process. In example embodiments, the underfill material layer 240 may include a non-conductive film (NCF).

The molding layer 250 may be arranged on the first surface 118 of the redistribution structure 101 and may cover at least a portion of the semiconductor chip 200 and a side surface of the conductive post 160. The molding layer 250 may include, for example, an epoxy molding compound (EMC). The molding layer 250 may not be limited to an EMC and may include various materials such as an epoxy material, a thermosetting material, a thermoplastic material, and an ultraviolet (UV) treated material. In example embodiments, the molding layer 250 may include a different material than the redistribution insulating layer 110. For example, when the molding layer 250 is formed from EMC, the redistribution insulating layer is formed from PID material such as PSPI.

In example embodiments, the molding layer 250 may cover a portion of the first surface 118 of the redistribution insulating layer 110 and a side surface of the semiconductor chip 200. A top surface 251 of the molding layer 250 may be coplanar with a top surface of the semiconductor chip 200. At this time, the top surface of the semiconductor chip 200 may be exposed to the outside. In some embodiments, the molding layer 250 may expose the top surface of the semiconductor chip 200.

The conductive post 160 may be spaced apart from the side surface of the semiconductor chip 200 in the horizontal direction and may have a post or pillar shape extending in the vertical direction and may penetrate the molding layer 250. The conductive post 160 may be arranged on the third redistribution pattern 140 that functions as a pad. The conductive post 160 may be electrically connected to the semiconductor chip 200 through at least a portion of the first through third redistribution patterns 120, 130, and 140 and electrically connected to the external connector 190 through at least a portion of the first through third redistribution patterns 120, 130, and 140 and the external electrode pad 150. For example, the conductive post 160 may be electrically connected to the chip pad 220 of the semiconductor chip 200 through a portion of the third redistribution pattern 140 below the conductive post 160, the second redistribution pattern 130, a portion of the third redistribution pattern 140 below the chip connector 230 and the chip connector 230.

For example, the conductive post 160 may include Cu but is not limited thereto. The conductive post 160 may include various conductive materials.

In example embodiments, a horizontal width of the conductive post 160 may be about 100 µm to about 250 µm.

The molding layer 250 may include a recess 257 to expose a top surface 161 of the conductive post 160 and an inner wall 253 defined by the recess 257 of the molding layer 250.

At this time, the top surface 161 of the conductive post 160 may be at a lower level than the top surface 251 of the molding layer 250. In example embodiments, a distance between the top surface 161 of the conductive post 160 and the top surface 251 of the molding layer 250 in the vertical direction may be about 1 µm to about 100 µm. In other words, a depth of the recess 257 of the molding layer 250 may be about 1 µm to about 100 µm.

In some embodiments, the top surface 161 of the conductive post 160 may be spaced apart from the first surface 118 of the redistribution insulating layer 110 by a first distance d1, and the top surface 251 of the molding layer 250 may be spaced apart from the first surface 118 of the redistribution insulating layer 110 by a second distance d2 that is greater than the first distance d1 as illustrated in FIG. 1. In some embodiments, a difference between the second distance d2 and the first distance d1 may be about 1 µm to about 100 µm. In some embodiments, the top surface 161 of the conductive post 160 may be recessed toward the redistribution insulating layer 110 with respect to the top surface 251 of the molding layer 250 as illustrated in FIGS. 1 and 2.

In example embodiments, a horizontal width of the recess 257 of the molding layer 250 may be equal to a horizontal width of the top surface 161 of the conductive post 160, and the top surface 161 of the conductive post 160 may be entirely exposed by the recess 257 of the molding layer 250.

In example embodiments, the horizontal width of the recess 257 of the molding layer 250 may be different from the horizontal width of the top surface 161 of the conductive post 160. For example, the horizontal width of the recess 257 of the molding layer 250 may be greater than the horizontal width of the top surface 161 of the conductive post 160, and the top surface 161 of the conductive post 160 may be entirely exposed by the recess 257 of the molding layer 250. Alternatively, the horizontal width of the recess 257 of the molding layer 250 may be less than the horizontal width of the top surface 161 of the conductive post 160, and the top surface 161 of the conductive post 160 may be partially exposed by the recess 257 of the molding layer 250.

In example embodiments, the roughness of the top surface 251 of the molding layer 250 may be greater than the roughness of the top surface 161 of the conductive post 160. For example, the arithmetical average roughness (Ra) of the top surface 251 of the molding layer 250 may be about two to eight times the Ra of the top surface 161 of the conductive post 160.

The roughness of the top surface 251 of the molding layer 250 may be greater than the roughness of the inner wall 253 of the molding layer 250. The term "roughness" as used herein may refer to an arithmetical average roughness (Ra).

Figure 3:
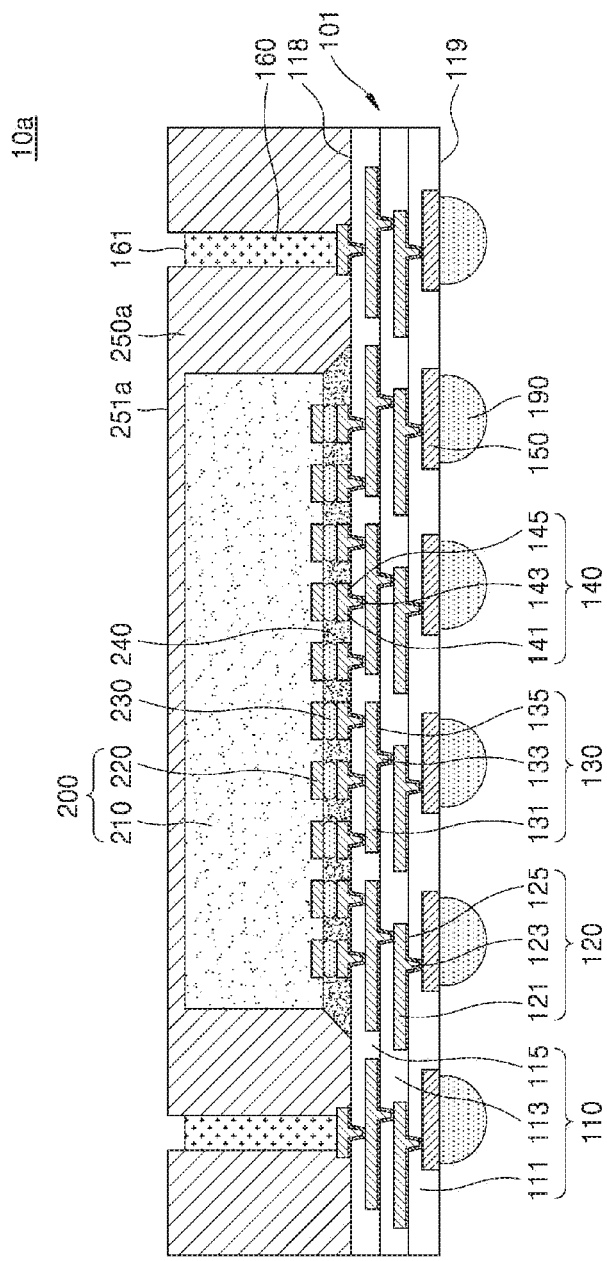
FIG. 3 is a cross-sectional view of a semiconductor package according to example embodiments of the inventive concept.

FIG. 3 is a cross-sectional view of a semiconductor package 10a according to example embodiments of the inventive concept.

The semiconductor package 10a of FIG. 3 may be the same as or similar to the semiconductor package 10 described with reference to FIGS. 1 and 2, except for a molding layer 250a. For convenience of description, the description will be focused on differences between the semiconductor package 10a and the semiconductor package 10 described with reference to FIGS. 1 and 2.

Referring to FIG. 3, the semiconductor package 10a may include the redistribution structure 101, the semiconductor chip 200, the conductive post 160, and the molding layer 250a. The molding layer 250a may cover the side surface and the top surface of the semiconductor chip 200 and the side surface of the conductive post 160. The molding layer 250a may include a planarized top surface. A top surface 251a of the molding layer 250a may be at a higher level than the top surface of the semiconductor chip 200. The top surface 251a of the molding layer 250a may also be at a higher level than the top surface 161 of the conductive post 160.

Figure 4:
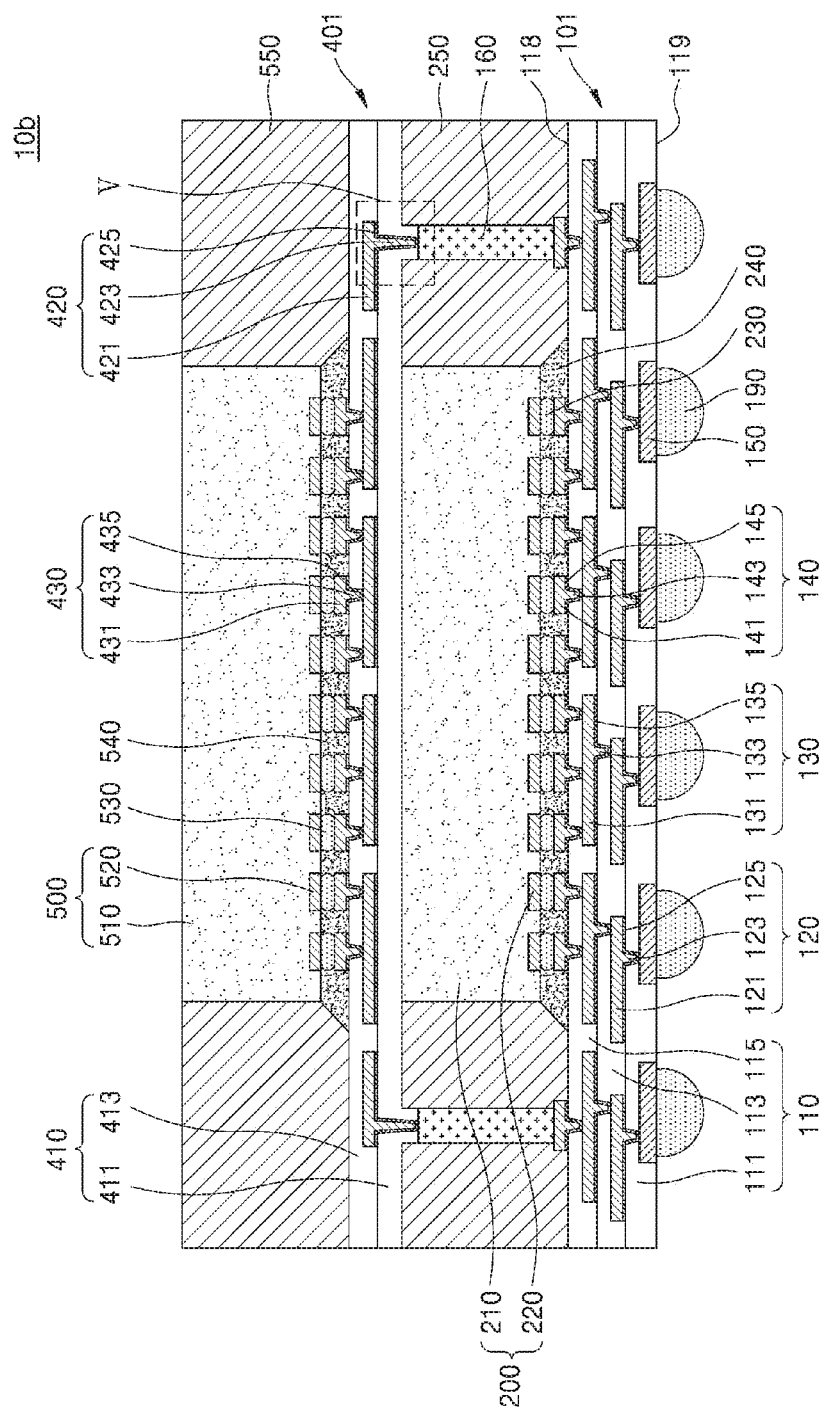
FIG. 4 is a cross-sectional view of a semiconductor package according to example embodiments of the inventive concept.
Figure 5:
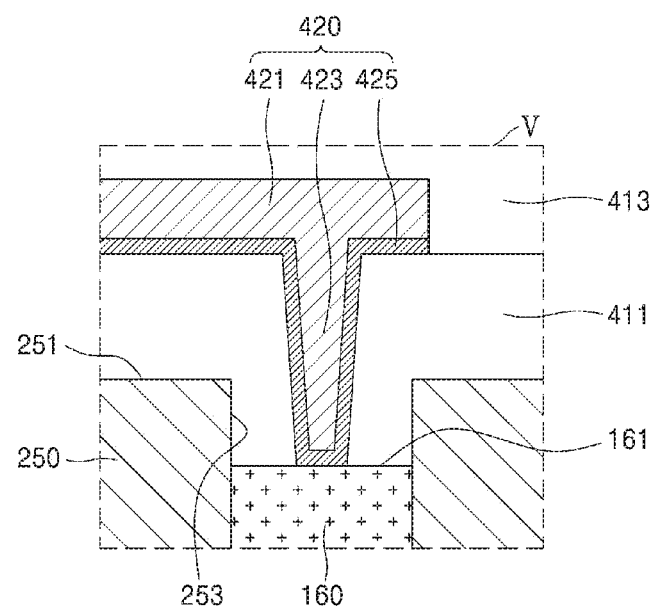
FIG. 5 is an enlarged cross-sectional view of a region V in FIG. 4.

FIG. 4 is a cross-sectional view of a semiconductor package 10b according to example embodiments of the inventive concept. FIG. 5 is an enlarged cross-sectional view of a region V in FIG. 4.

The semiconductor package 10b shown in FIGS. 4 and 5 may be the same as or similar to the semiconductor package 10 described with reference to FIGS. 1 and 2, except that the semiconductor package 10b further includes an upper redistribution structure 401 and an upper semiconductor chip 500. For convenience of description, the description will be focused on differences between the semiconductor package 10b and the semiconductor package 10 described with reference to FIGS. 1 and 2.

Referring to FIGS. 4 and 5, the semiconductor package 10b may include the redistribution structure 101, the semiconductor chip 200, the conductive post 160, the molding layer 250, the upper redistribution structure 401, the upper semiconductor chip 500, and an upper molding layer 550.

The redistribution structure 101 may include the redistribution insulating layer 110, the first through third redistribution patterns 120, 130, and 140, and the external electrode pad 150. The redistribution structure 101 of FIG. 4 may be substantially the same as or similar to the redistribution structure 101 described with reference to FIGS. 1 and 2. The semiconductor chip 200, the conductive post 160, and the molding layer 250 shown in FIGS. 4 and 5 may be substantially the same as or similar to the semiconductor chip 200, the conductive post 160, and the molding layer 250 described with reference to FIGS. 1 and 2.

The upper redistribution structure 401 may include an upper redistribution insulating layer 410 and a plurality of upper redistribution patterns, e.g., first and second upper redistribution patterns 420 and 430. The plurality of upper redistribution patterns may be electrically connected to the third redistribution pattern 130 of the redistribution structure 101 through the conductive post 160.

The upper redistribution insulating layer 410 may include a plurality of upper insulating layers, e.g., first and second upper insulating layers 411 and 413, sequentially stacked on the semiconductor chip 200 and the molding layer 250. For example, the first and second upper insulating layers 411 and 413 may include a PID material, e.g., photosensitive polyimide. In some embodiments, the first and second upper insulating layers 411 and 413 may include oxide or nitride.

The first and second upper redistribution patterns 420 and 430 may include first and second upper conductive line patterns 421 and 431, respectively, and first and second upper conductive via patterns 423 and 433, respectively. Each of the first and second upper conductive line patterns 421 and 431 may be arranged on at least one selected from a top surface and a bottom surface of a corresponding one of the first and second upper insulating layers 411 and 413. The first and second upper conductive via patterns 423 and 433 may penetrate at least one selected from the first and second upper insulating layers 411 and 413. The first and second upper conductive via patterns 423 and 433 may be connected to at least one selected from the first and second upper conductive line patterns 421 and 431 or the top surface 161 of the conductive post 160.

For example, the upper redistribution insulating layer 410 may include the first upper insulating layer 411 and the second upper insulating layer 413, which are sequentially stacked on the semiconductor chip 200 and the molding layer 250.

The first upper insulating layer 411 may cover the top surface of the semiconductor chip 200 and the top surface 251 of the molding layer 250. The first upper insulating layer 411 may fill the recess (257 in FIG. 2) of the molding layer 250. A portion of the first upper insulating layer 411, which fills the recess of the molding layer 250, may cover the inner wall 253 of the molding layer 250 and the top surface 161 of the conductive post 160. Since the first upper insulating layer 411 fills the recess of the molding layer 250, a contact area between the first upper insulating layer 411 and the molding layer 250 increases, and accordingly, an adhesive strength of the first upper insulating layer 411 to the molding layer 250 may increase and delamination of the first upper insulating layer 411 may be reduced or possibly prevented.

The first upper redistribution pattern 420 may include the first upper conductive line pattern 421, the first upper conductive via pattern 423, and a first upper seed layer 425. The second upper redistribution pattern 430 may include the second upper conductive line pattern 431, the second upper conductive via pattern 433, and a second upper seed layer 435.

The first upper insulating layer 411 may include a via opening that exposes a portion of the top surface 161 of the conductive post 160. The first upper seed layer 425 may be arranged on a portion of a top surface of the first upper insulating layer 411, an inner wall of the via opening of the first upper insulating layer 411, and a portion of the top surface 161 of the conductive post 160, which is exposed through the via opening of the first upper insulating layer 411. A portion of the first upper seed layer 425 may be between the first upper conductive line pattern 421 and the top surface of the first upper insulating layer 411, and another portion of the first upper seed layer 425 may be arranged between the first upper conductive via pattern 423 and the top surface 161 of the conductive post 160 to surround a side wall of the first upper conductive via pattern 423.

The first upper conductive line pattern 421 and the first upper conductive via pattern 423 may be arranged on the first upper seed layer 425. The first upper conductive line pattern 421 and the first upper conductive via pattern 423 may be integrally formed together using a plating process. The first upper conductive line pattern 421 may be arranged on the first upper conductive via pattern 423 and a portion of the first upper seed layer 425 on the top surface of the first upper insulating layer 411. The first upper conductive via pattern 423 may cover a portion of the first upper seed layer 425 in the via opening of the first upper insulating layer 411 and fill the via opening of the first upper insulating layer 411. The first upper conductive via pattern 423 may extend in the vertical direction, may penetrate the first upper insulating layer 411, and may electrically connect the first upper conductive line pattern 421 to the conductive post 160.

In example embodiments, the first upper conductive via pattern 423 may have a shape, of which the horizontal width increases as a distance from the top surface 161 of the conductive post 160 increases. In some embodiments, the first upper conductive via pattern 423 may have a width tapered toward the conductive post 160 as illustrated in FIG. 4.

In example embodiments, the horizontal width of the first upper conductive via pattern 423 may be about 25 µm to about 45 µm.

In example embodiments, the horizontal width of a bottom end of the first upper conductive via pattern 423, which is adjacent to the conductive post 160, may be about 10% to about 45% of the horizontal width of the conductive post 160.

The second upper insulating layer 413, which covers a portion of the first upper conductive line pattern 421 and has a via opening exposing the other portion of the first upper conductive line pattern 421, may be stacked on the first upper insulating layer 411.

The second upper seed layer 435 may be arranged on a portion of a top surface of the second upper insulating layer 413, an inner wall of the via opening of the second upper insulating layer 413, and a portion of a top surface of the first upper conductive line pattern 421, which is exposed through the via opening of the second upper insulating layer 413. A portion of the second upper seed layer 435 may be between the second upper conductive line pattern 431 and the top surface of the second upper insulating layer 413, and another portion of the second upper seed layer 435 may be arranged between the second upper conductive via pattern 433 and the first upper conductive line pattern 421 to surround a side wall of the second upper conductive via pattern 433.

The second upper conductive via pattern 433 and the second upper conductive line pattern 431 may be arranged on the second upper seed layer 435. The second upper conductive via pattern 433 and the second upper conductive line pattern 431 may be integrally formed together using a plating process. The second upper conductive line pattern 431 may be arranged on the second upper conductive via pattern 433 and a portion of the second upper seed layer 435 on the top surface of the second upper insulating layer 413. The second upper conductive via pattern 433 may cover a portion of the second upper seed layer 435 in the via opening of the second upper insulating layer 413 and fill the via opening of the second upper insulating layer 413. The second upper conductive via pattern 433 may extend in the vertical direction, may penetrate the second upper insulating layer 413, and may electrically connect the second upper conductive line pattern 431 to the first upper conductive line pattern 421.

The upper semiconductor chip 500 may be attached to the upper redistribution structure 401. For example, the upper semiconductor chip 500 may be mounted on the upper redistribution structure 401 in a flip-chip manner. The upper semiconductor chip 500 may include a semiconductor substrate 510 and a chip pad 520. A chip connector 530 may be arranged between the chip pad 520 of the upper semiconductor chip 500 and the second upper redistribution pattern 430 of the upper redistribution structure 401. The chip connector 530 may electrically connect the chip pad 520 of the upper semiconductor chip 500 to the second upper redistribution pattern 430. An underfill material layer 540 may be arranged between the upper semiconductor chip 500 and the upper redistribution structure 401 to surround the chip connector 530. The upper molding layer 550 covering at least a portion of the upper semiconductor chip 500 may be arranged on the upper redistribution structure 401.

In example embodiments, the semiconductor chip 200 and the upper semiconductor chip 500 may be of different types. For example, when the semiconductor chip 200 is a logic chip, the upper semiconductor chip 500 may be a memory chip. In example embodiments, the semiconductor package 10b may include a system-in-package (SIP), in which different types of semiconductor chips are electrically connected to each other and operate as a single system. In example embodiments, the semiconductor chip 200 and the upper semiconductor chip 500 may be of the same types, and both the semiconductor chip 200 and the upper semiconductor chip 500 are memory chips or logic chips.

Figure 6:
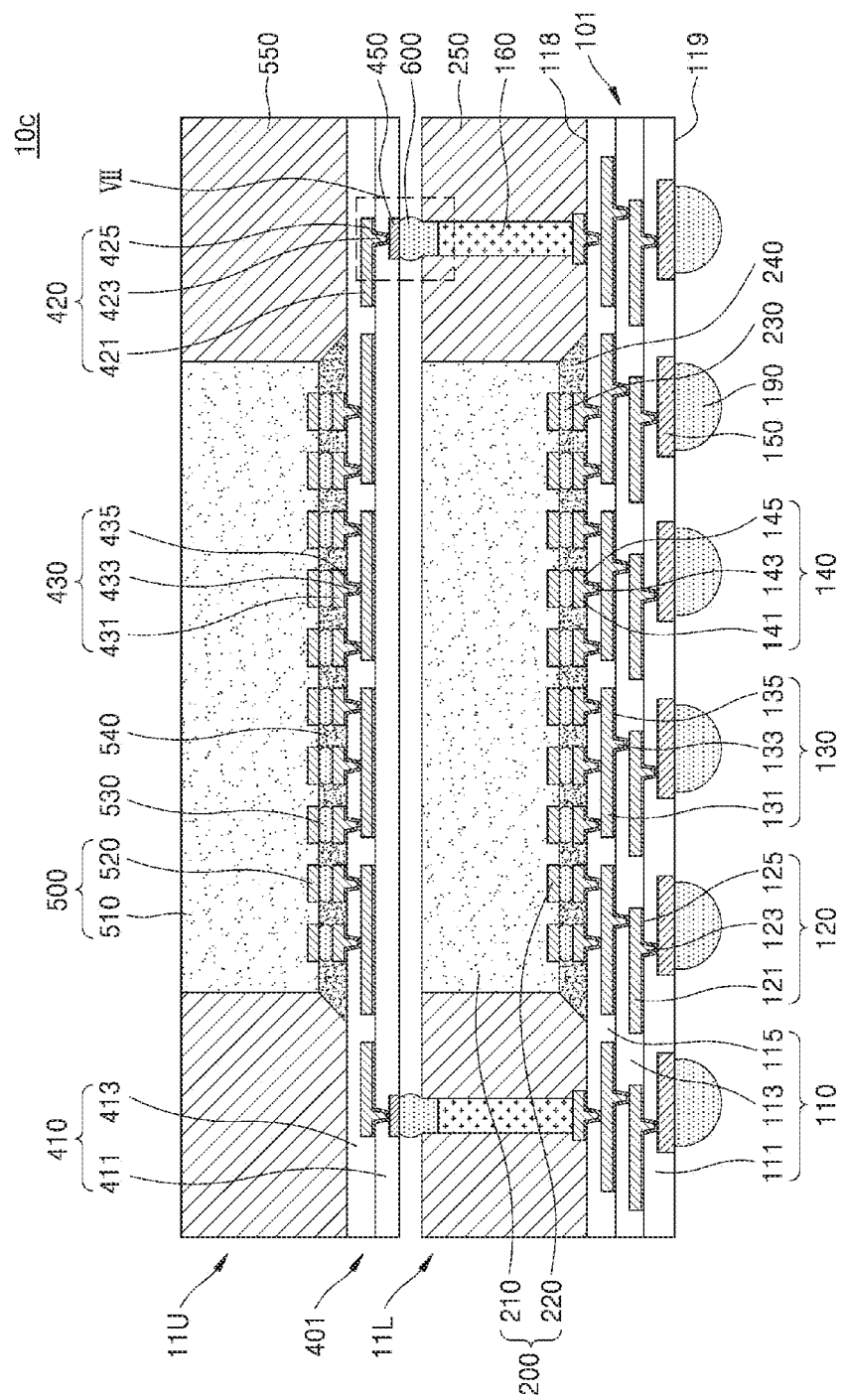
FIG. 6 is a cross-sectional view of a semiconductor package according to example embodiments of the inventive concept.
Figure 7:
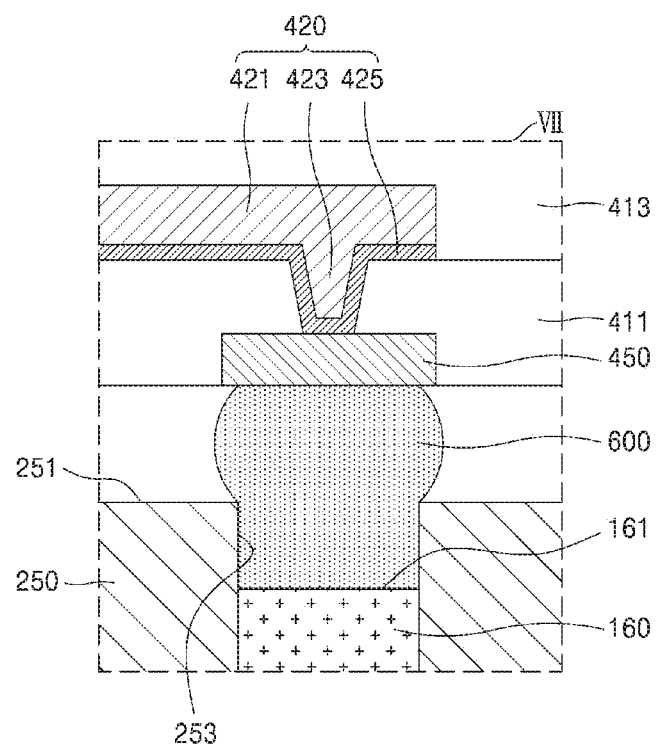
FIG. 7 is an enlarged cross-sectional view of a region VII in FIG. 6.

FIG. 6 is a cross-sectional view of a semiconductor package 10c according to example embodiments of the inventive concept. FIG. 7 is an enlarged cross-sectional view of a region VII in FIG. 6. For convenience of description, redundant descriptions already given above may be briefly described or omitted.

Referring to FIGS. 6 and 7, the semiconductor package 10c may include a lower package 11L and an upper package 11U on the lower package 11L. The semiconductor package 10c may be a package-on-package type, in which the upper package 11U is attached to the lower package 11L.

The lower package 11L may include the redistribution structure 101, the semiconductor chip 200, the conductive post 160, and the molding layer 250. The lower package 11L may be substantially the same as or similar to the semiconductor package 10 described with reference to FIGS. 1 and 2.

The upper package 11U may include the upper redistribution structure 401, the upper semiconductor chip 500, the chip connector 530, the underfill material layer 540, and the upper molding layer 550. The upper semiconductor chip 500, the upper semiconductor chip 500, the underfill material layer 540, and the upper molding layer 550 may be substantially the same as or similar to the upper semiconductor chip 500, the chip connector 530, the underfill material layer 540, and the upper molding layer 550, which have been described with reference to FIGS. 4 and 5.

The upper redistribution structure 401 of the upper package 11U may include the upper redistribution insulating layer 410, the plurality of upper redistribution patterns, e.g., first and second upper redistribution patterns 420 and 430, and an electrode pad 450.

For example, the upper redistribution insulating layer 410 may include the first upper insulating layer 411 and the second upper insulating layer 413, which are sequentially stacked on the lower package 11L.

For example, the first upper redistribution pattern 420 may include the first upper conductive line pattern 421, the first upper conductive via pattern 423, and the first upper seed layer 425. The first upper conductive line pattern 421 may extend along the top surface of the first upper insulating layer 411, and the first upper conductive via pattern 423 may partially penetrate the first upper insulating layer 411 and extend between the first upper conductive line pattern 421 and the electrode pad 450 in the vertical direction. A portion of the first upper seed layer 425 may be between the first upper conductive line pattern 421 and the first upper insulating layer 411 and another portion of the first upper seed layer 425 may be arranged between the first upper conductive via pattern 423 and the electrode pad 450 to surround the side wall of the first upper conductive via pattern 423.

For example, the second upper redistribution pattern 430 may include the second upper conductive line pattern 431, the second upper conductive via pattern 433, and the second upper seed layer 435. The second upper conductive line pattern 431 may extend along the top surface of the second upper insulating layer 413, and the second upper conductive via pattern 433 may penetrate the second upper insulating layer 413 and extend between the second upper conductive line pattern 431 and the first upper conductive line pattern 421 in the vertical direction. A portion of the second upper seed layer 435 may be between the second upper conductive line pattern 431 and the second upper insulating layer 413, and another portion of the second upper seed layer 435 may be arranged between the second upper conductive via pattern 433 and the first upper conductive line pattern 421 to surround the side wall of the second upper conductive via pattern 433.

The upper package 11U may be electrically and/or physically connected to the lower package 11L via an interpackage connector 600 between the upper package 11U and the lower package 11L. The interpackage connector 600 may be in contact with the electrode pad 450 of the upper redistribution structure 401 and the conductive post 160 and electrically connect the electrode pad 450 of the upper redistribution structure 401 to the conductive post 160.

In example embodiments, the interpackage connector 600 may fill the recess (257 in FIG. 2) of the molding layer 250. The interpackage connector 600 may cover the inner wall 253 of the molding layer 250 and the top surface 161 of the conductive post 160. Since the interpackage connector 600 fills the recess of the molding layer 250, a contact area between the interpackage connector 600 and the molding layer 250 may increase, and accordingly, an adhesive strength between the interpackage connector 600 and the molding layer 250 may increase.

Figure 8A:
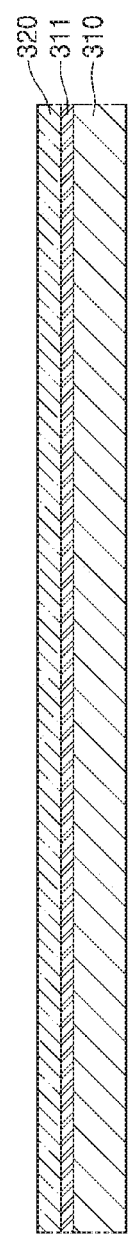
Figure 8B:
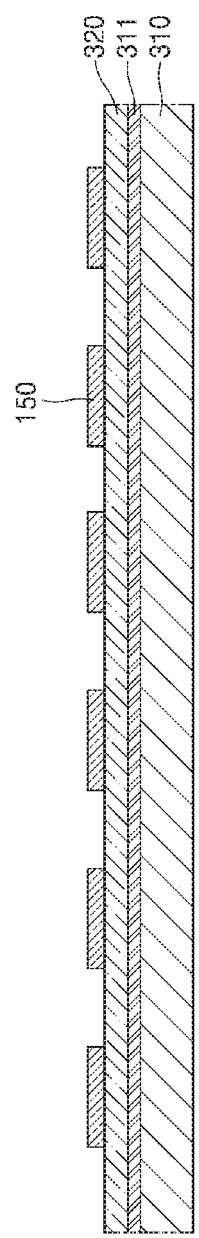
Figure 8C:
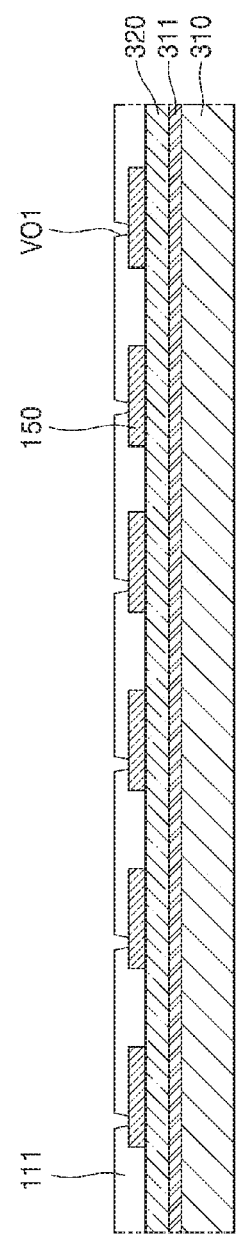
Figure 8D:
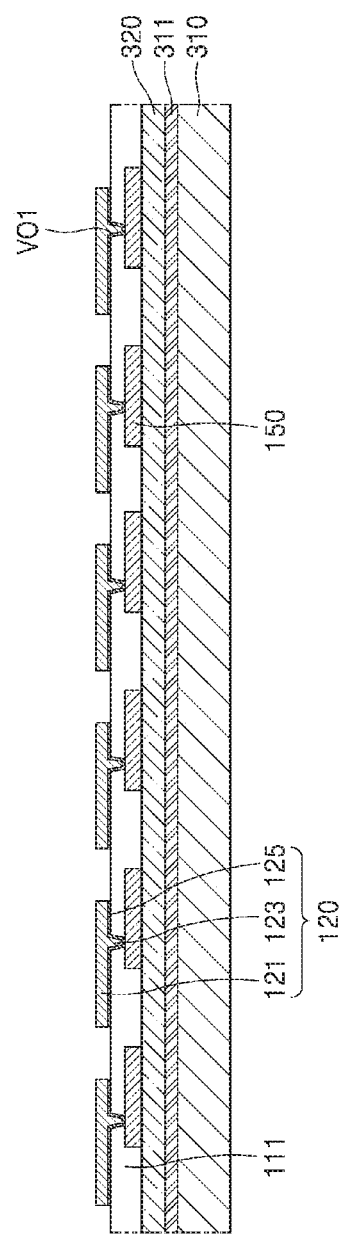
Figure 8E:
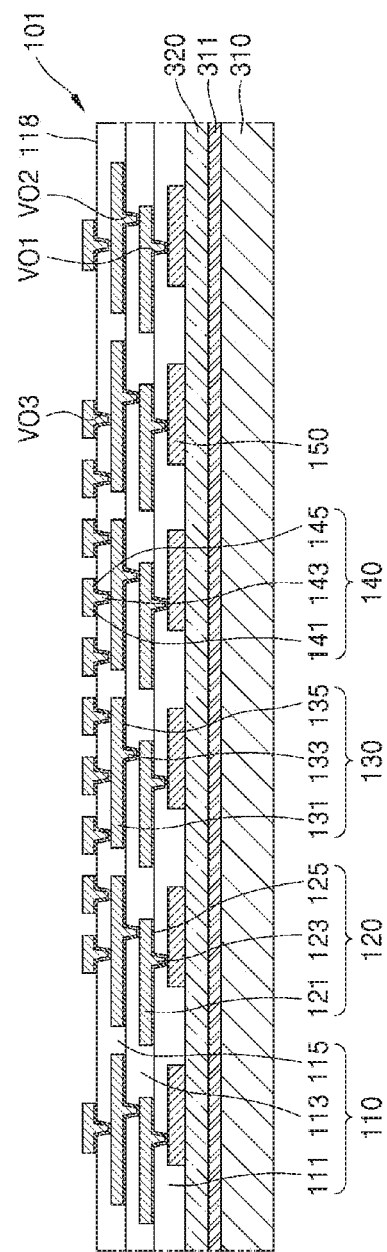
Figure 8F:
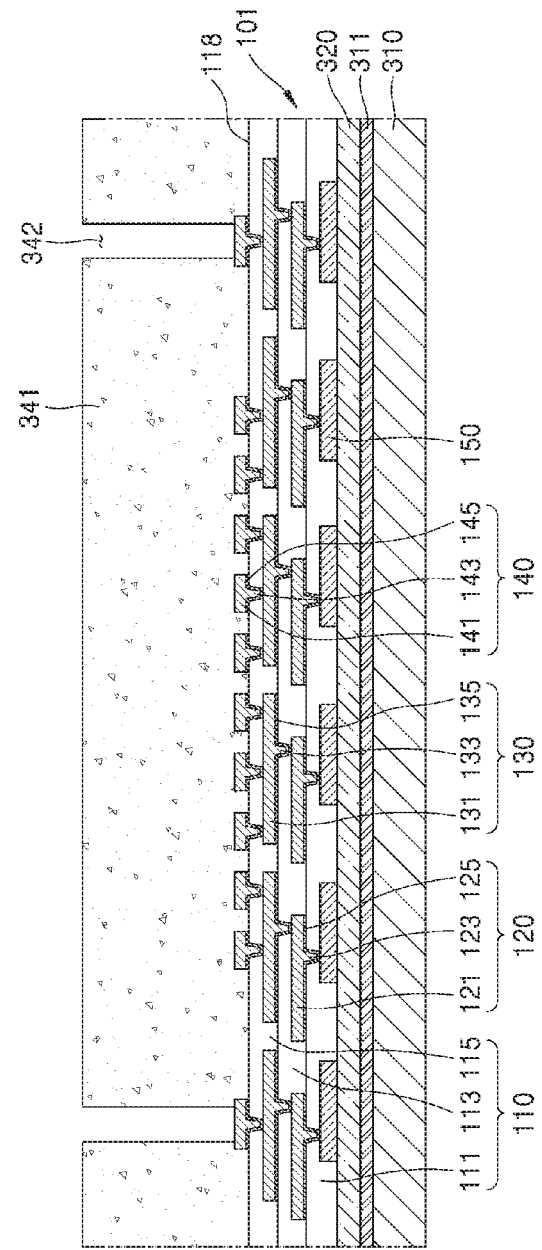
Figure 8G:
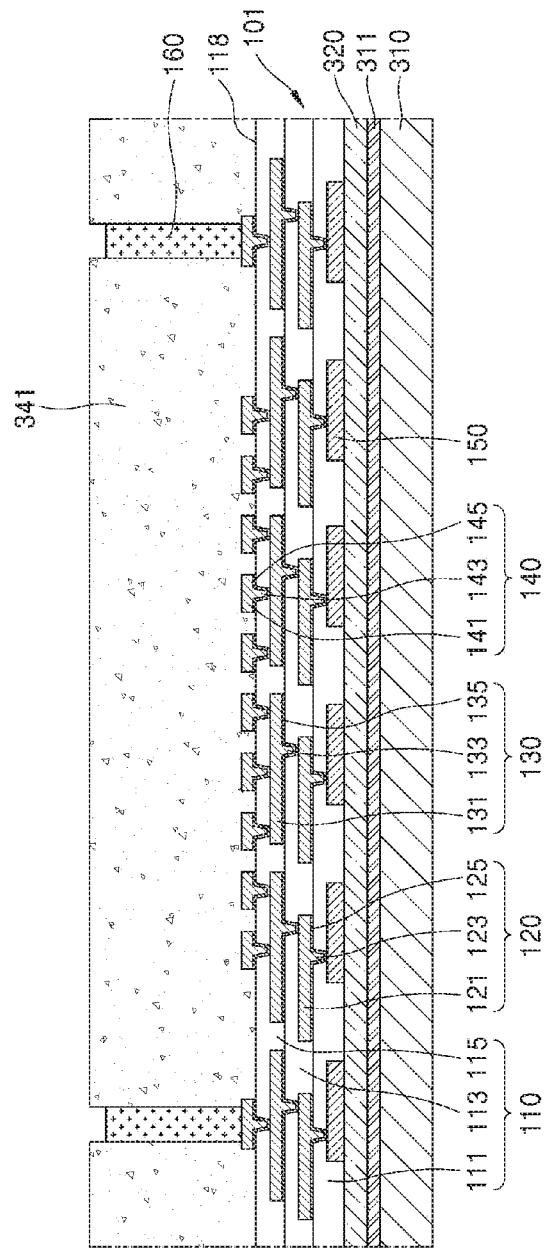
Figure 8H:
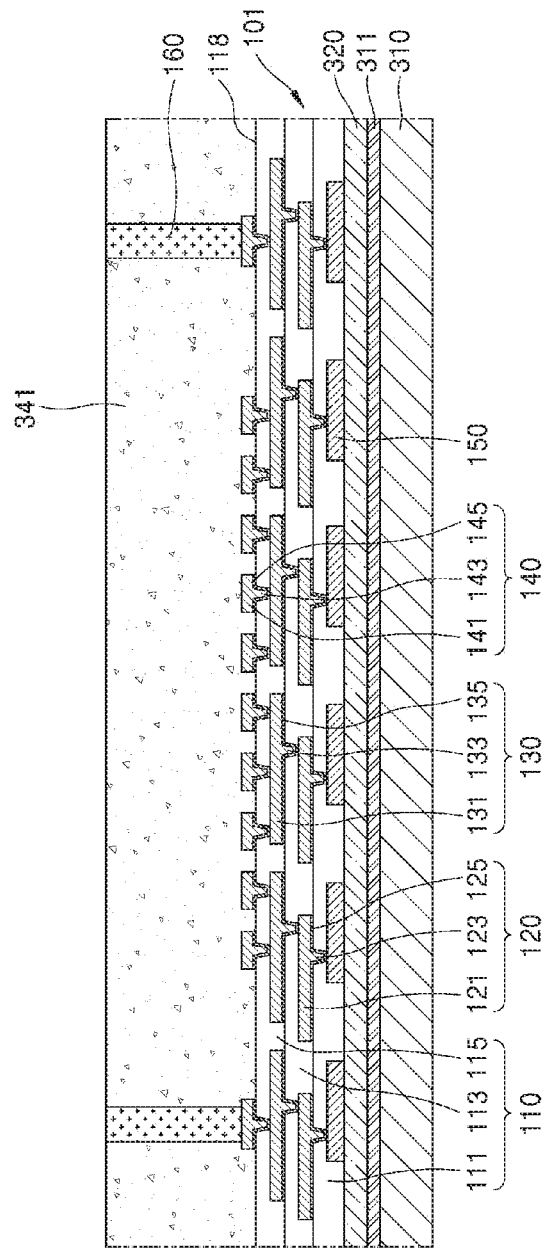
Figure 8I:
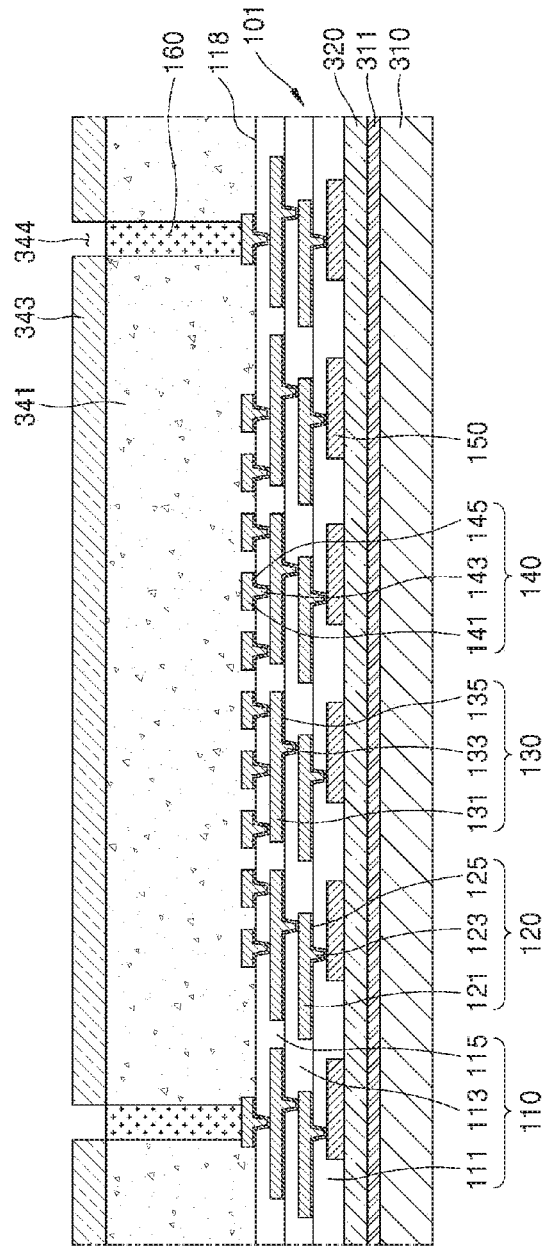
Figure 8J:
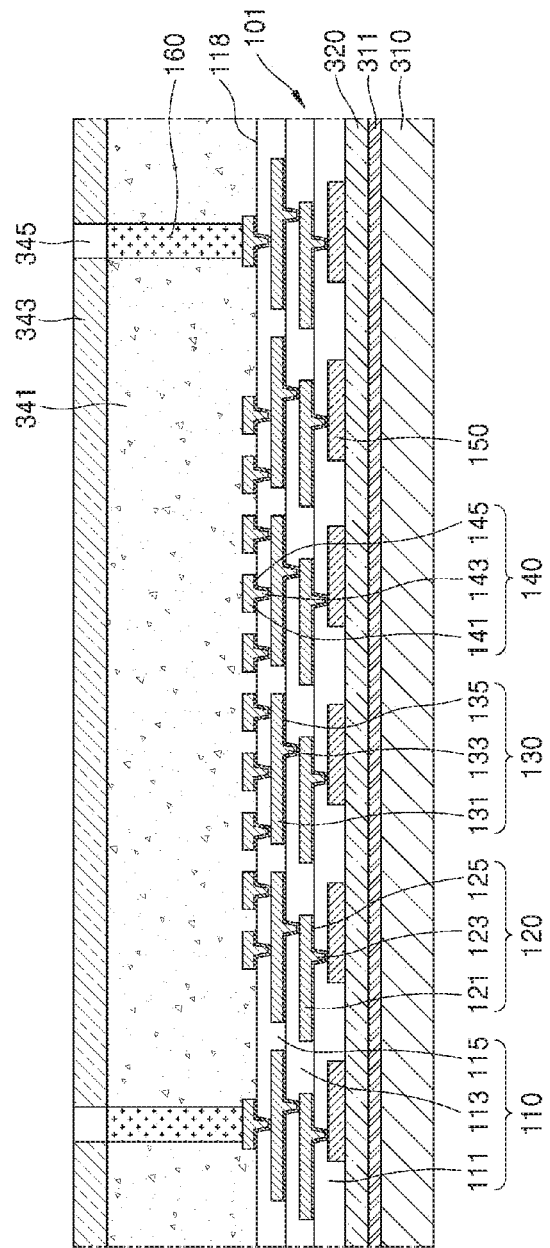
Figure 8K:
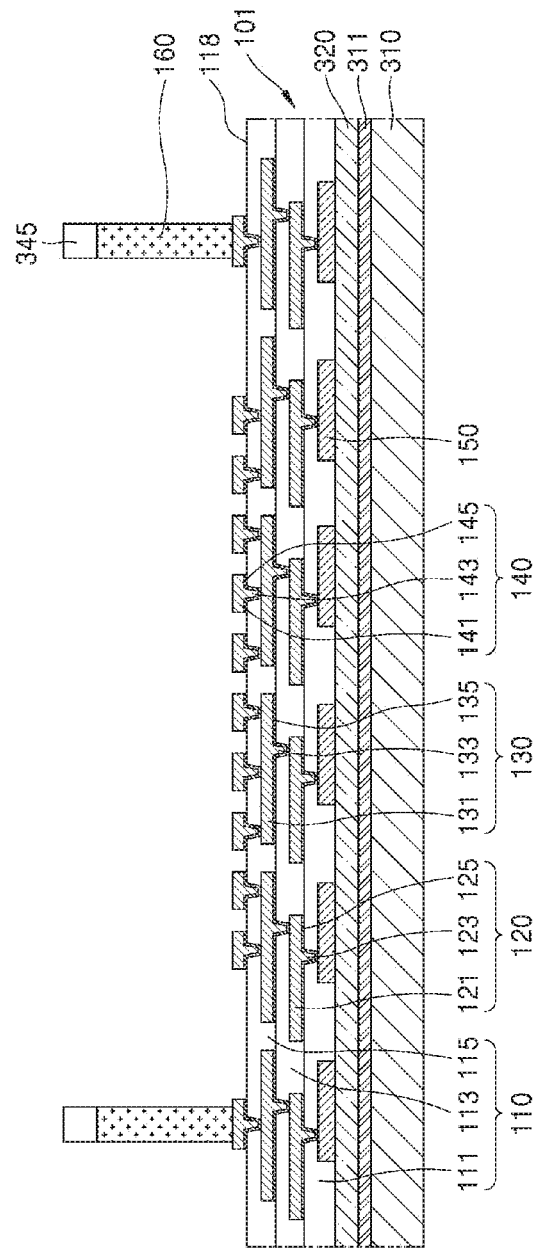
Figure 8L:
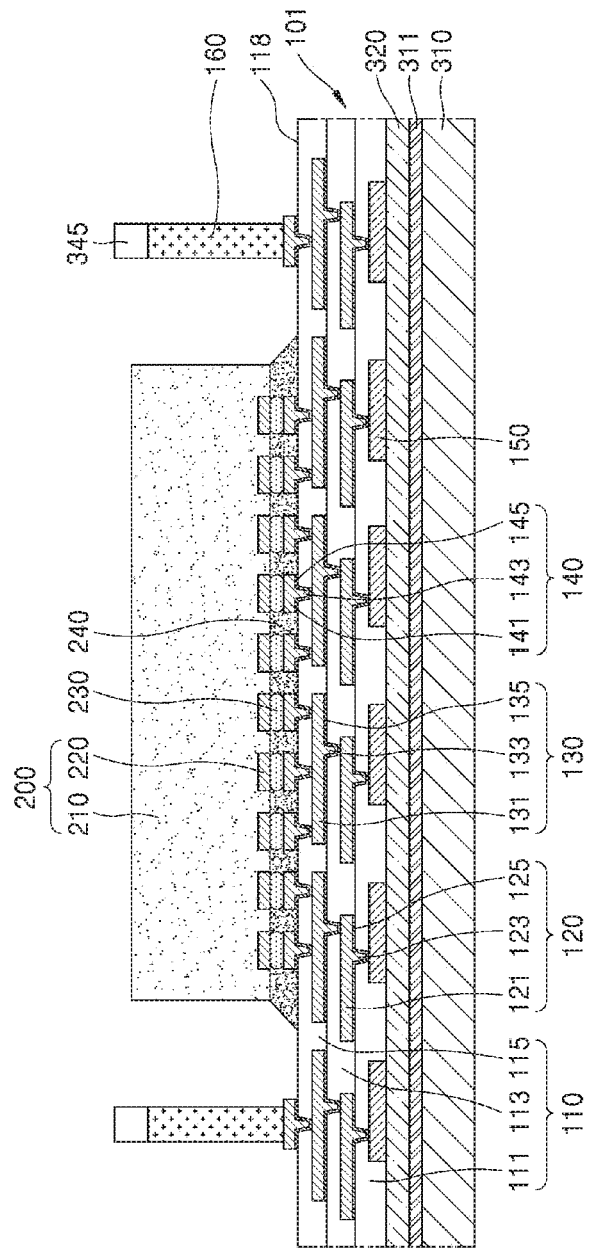
Figure 8M:
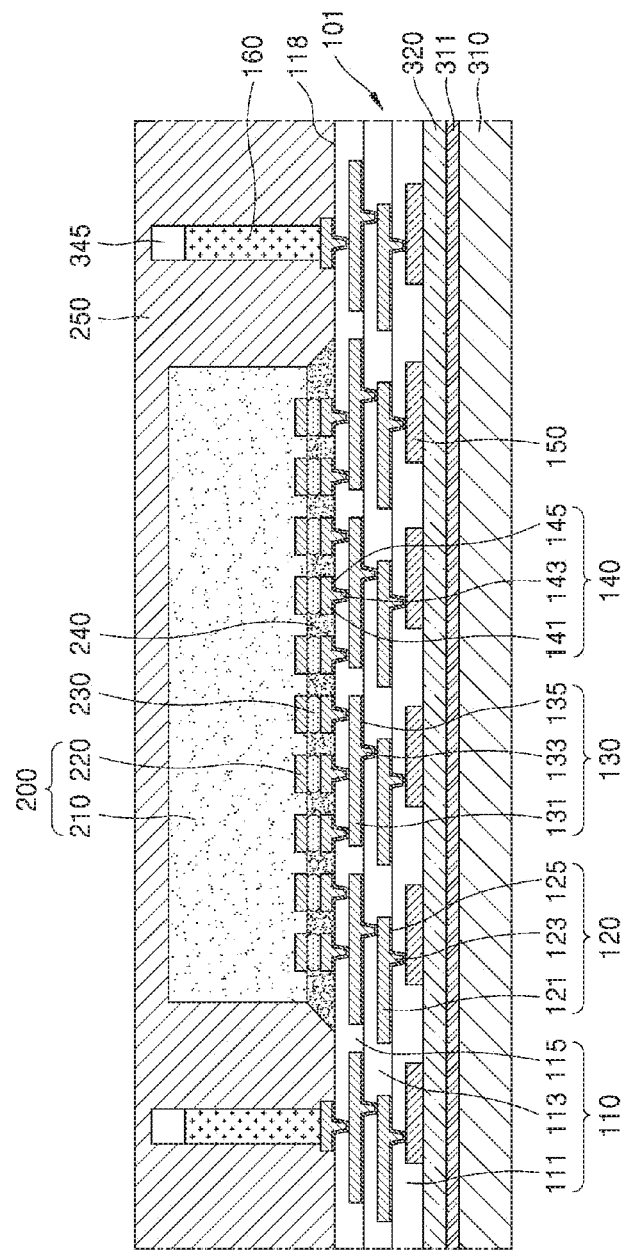
Figure 8N:
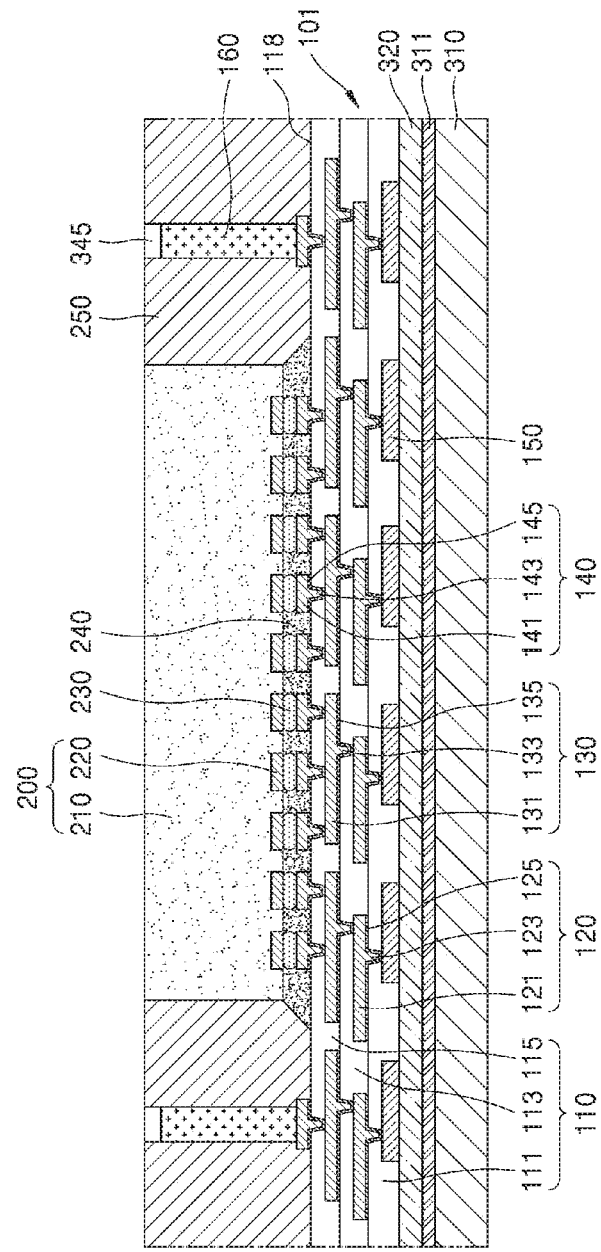
Figure 80:
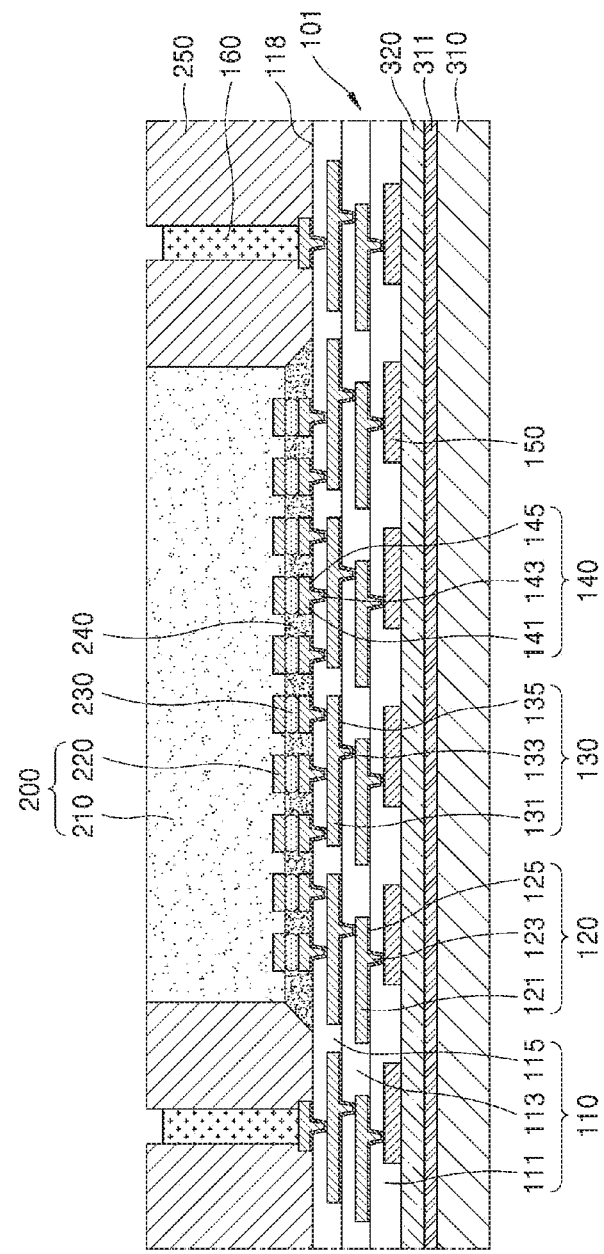
Figure 8Q:
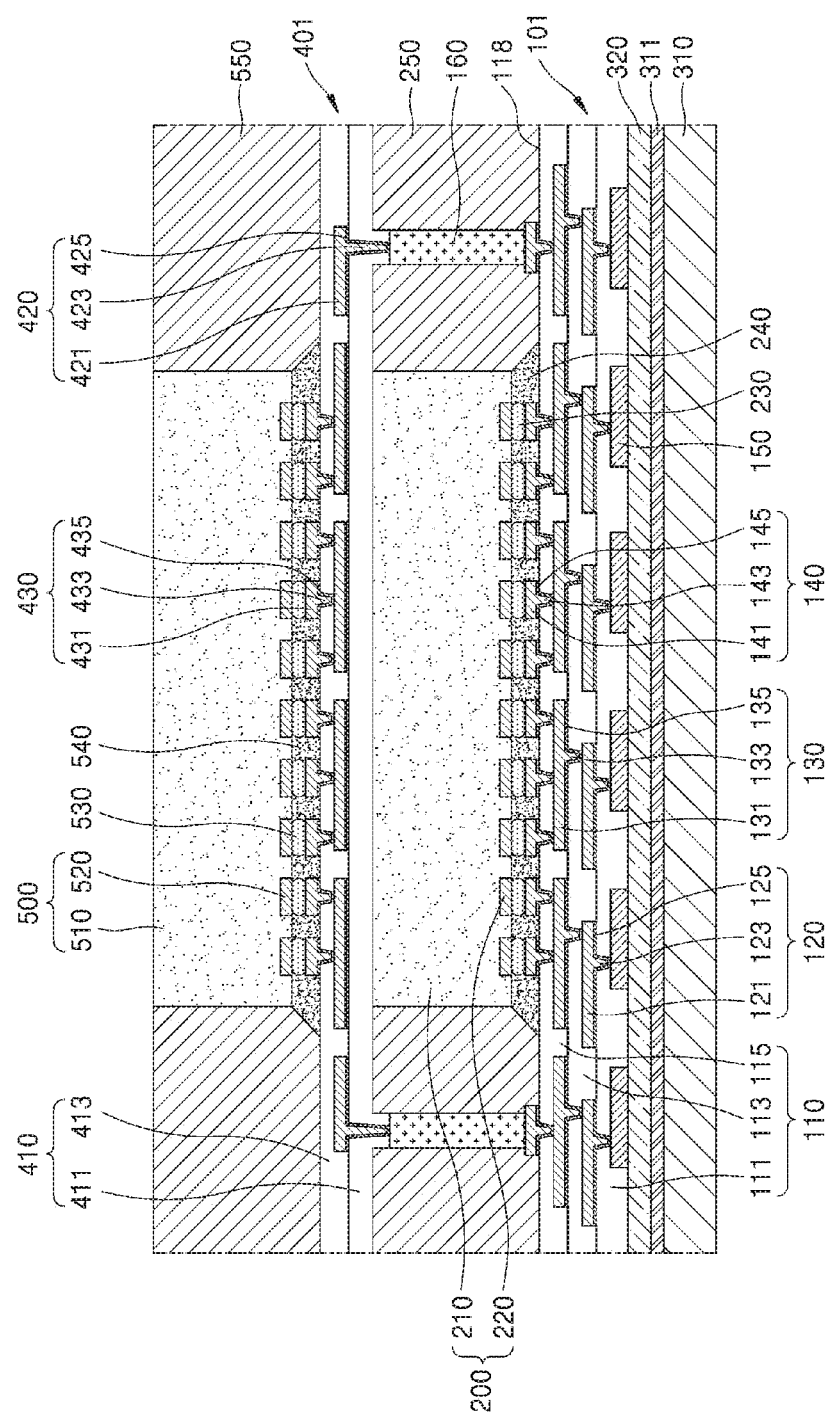
Figure 8R:
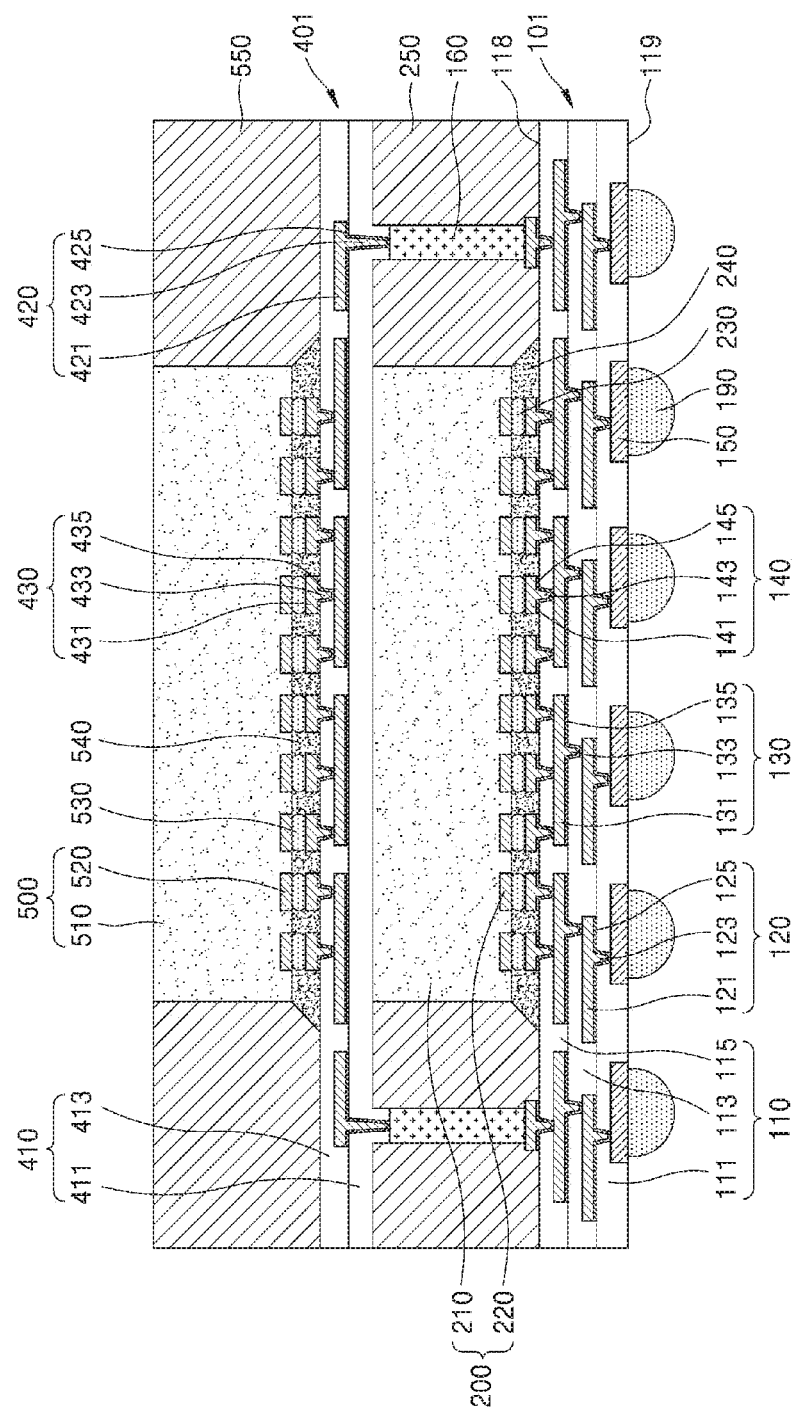
Figure 8S:
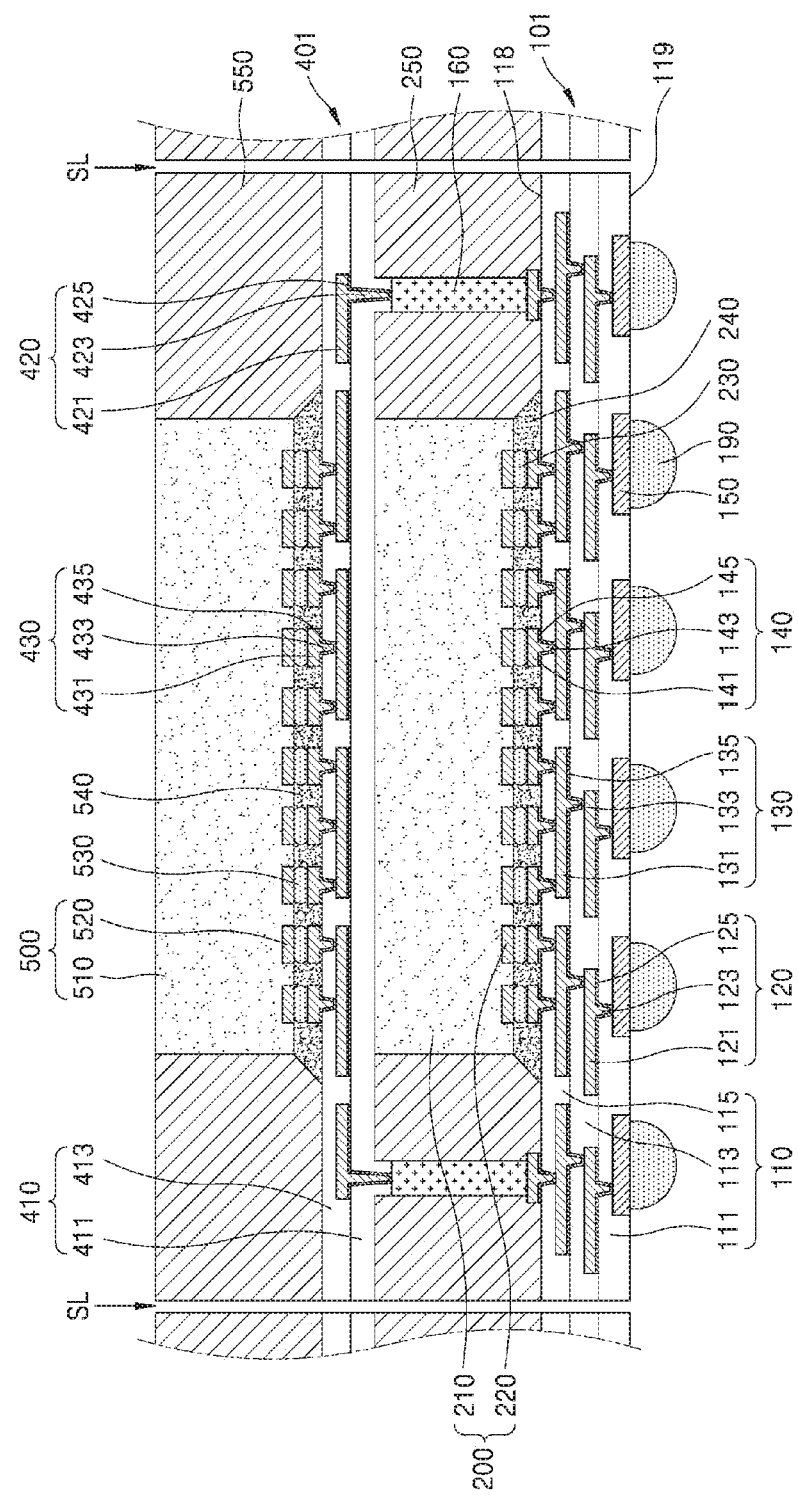

FIGS. 8A through 8S are cross-sectional views of sequential stages in a method of manufacturing a semiconductor package, according to example embodiments of the inventive concept. Hereinafter, a method of manufacturing the semiconductor package 10b of FIG. 4 will be described with reference to FIGS. 8A through 8S.

Referring to FIG. 8A, a cover layer 320 is formed on a carrier substrate 310, to which a release film 311 is attached. The cover layer 320 may include the same insulating material as or a different insulating material than the redistribution insulating layer 110 (in FIG. 4). For example, the cover layer 320 may include a material film including an organic compound. In example embodiments, the cover layer 320 may include photosensitive polyimide. In some embodiments, the cover layer 320 may include oxide or nitride.

The carrier substrate 310 may include a material that has stability with respect to a baking process and an etching process. In the case where the carrier substrate 310 is separated and removed by laser ablation afterward, the carrier substrate 310 may include a transparent substrate. Optionally, in the case where the carrier substrate 310 is separated and removed by heating, the carrier substrate 310 may include a heat resistant substrate. In example embodiments, the carrier substrate 310 may include a glass substrate. In example embodiments, the carrier substrate 310 may include heat resistant organic polymer material, such as polyimide, poly(etheretherketone) (PEEK), poly(ethersulfone) (PES), or poly(phenylene sulfide) (PPS), but is not limited thereto.

The release film 311 may include, for example, a laser reactive layer that reacts to laser radiation and evaporates such that the carrier substrate 310 is separable. The release film 311 may include, for example, a carbon material layer. For example, the release film 311 may include an amorphous carbon layer (ACL), a hydrocarbon compound having a relatively high carbon content of about 85 wt % to about 99 wt % based on the total weight, or a spin-on hardmask (SOH) including a derivative thereof.

Referring to FIG. 8B, the external electrode pad 150 is formed on the cover layer 320. To form the external electrode pad 150, a conductive material film may be formed on the cover layer 320 and patterned. The external electrode pad 150 may be formed to have a uniform thickness on a top surface of the cover layer 320, and a bottom surface of the external electrode pad 150, which is in contact with the top surface of the cover layer 320, may be flat.

In example embodiments, the external electrode pad 150 may include a single metal material. In example embodiments, the external electrode pad 150 may have a multilayer structure, in which multiple layers respectively include different metal materials.

Referring to FIG. 8C, after the external electrode pad 150 is formed, the first insulating layer 111, which includes the first via opening VO1 exposing a portion of the external electrode pad 150, is formed. For example, to form the first insulating layer 111, an insulating material film covering the external electrode pad 150 and the cover layer 320 may be formed, and a portion of the insulating material film may be removed using exposure and development to form the first via opening VO1. The portion of the external electrode pad 150 may be exposed through the first via opening VO1.

For example, to form the first via opening VO1, reactive ion etching (RIE) using plasma, laser drilling, or the like may be performed. The first via opening VO1 may have a shape, of which the horizontal width decreases downward (toward the external electrode pad 150).

Referring to FIG. 8D, the first seed layer 125, the first conductive line pattern 121, and the first conductive via pattern 123 are formed on a resultant structure of FIG. 8C.

In detail, a seed metal film is formed on the top surface of first insulating layer 111, the inner wall of the first insulating layer 111 provided by the first via opening VO1, and the external electrode pad 150 exposed through the first via opening VO1. For example, the seed metal film may be formed using physical vapor deposition. After the seed metal film is formed, a photoresist pattern including an opening is formed and a plating process is performed using the seed metal film as a seed such that the first conductive line pattern 121 and the first conductive via pattern 123 are formed. Thereafter, the photoresist pattern is removed, and a portion of the seed metal film exposed by removing the photoresist pattern is removed. As a result of removing the seed metal film, the first seed layer 125 may be formed between the top surface of the first insulating layer 111 and the first conductive line pattern 121, between the first conductive via pattern 123 and the inner wall of the first insulating layer 111, the inner wall being provided by the first via opening VO1, and between the first conductive via pattern 123 and the external electrode pad 150. The first seed layer 125, the first conductive line pattern 121, and the first conductive via pattern 123 may form the first redistribution pattern 120.

Referring to FIG. 8E, the second insulating layer 113 including the second via opening VO2, the second redistribution pattern 130, the third insulating layer 115 including the third via opening VO3, and the third redistribution pattern 140 may be sequentially formed on a resultant structure of FIG. 8D using a procedure which is substantially the same as or similar to that described with reference to FIGS. 8C and 8D. The first through third insulating layers 111, 113, and 115 and the first through third redistribution patterns 120, 130, and 140 may form the redistribution structure 101. Although FIG. 8E shows a single redistribution structure 101 formed on the top surface of the cover layer 320, in some embodiments, multiple redistribution structures 101 spaced apart from each other in a horizontal direction may be formed.

In detail, the second seed layer 135 may be formed to cover the top surface of the second insulating layer 113, the inner wall of the second insulating layer 113 defining the second via opening VO2, and a portion of the first conductive line pattern 121, which is exposed through the second via opening VO2. The second conductive line pattern 131 may extend along the top surface of the second insulating layer 113, and the second conductive via pattern 133 may fill the second via opening VO2. The second seed layer 135, the second conductive line pattern 131, and the second conductive via pattern 133 may form the second redistribution pattern 130.

The third seed layer 145 may be formed to cover the top surface of the third insulating layer 115, the inner wall of the third insulating layer 115 defining the third via opening VO3, and a portion of the second conductive line pattern 131, which is exposed through the third via opening VO3. The third conductive line pattern 141 may extend along the top surface of the third insulating layer 115, and the third conductive via pattern 143 may fill the third via opening VO3. The third seed layer 145, the third conductive line pattern 141, and the third conductive via pattern 143 may form the third redistribution pattern 140.

Referring to FIG. 8F, a first photoresist pattern 341 is formed on the first surface 118 of the redistribution insulating layer 110. The first photoresist pattern 341 may include an opening 342 that exposes a portion of the third conductive line pattern 141 of the third redistribution pattern 140. The opening 342 of the first photoresist pattern 341 may define a region, in which the conductive post 160 (in FIG. 8G) is formed in a succeeding process.

Referring to FIGS. 8G and 8F, the conductive post 160 is formed in the opening 342 of the first photoresist pattern 341. The conductive post 160 may be formed on the portion of the third conductive line pattern 141 of the third redistribution pattern 140, the portion being exposed through the opening 342 of the first photoresist pattern 341, to at least partially fill the opening 342 of the first photoresist pattern 341. The conductive post 160 may include Cu but is not limited thereto.

Referring to FIGS. 8H and 8G, a polishing process may be performed on the first photoresist pattern 341 and the conductive post 160 until a planarized surface is obtained throughout the top surface of the first photoresist pattern 341 and the top surface of the conductive post 160. For example, to obtain the planarized surface, etch-back or chemical mechanical polishing (CMP) may be performed. Due to the polishing process, the top surface of the first photoresist pattern 341 may be coplanar with the top surface of the conductive post 160. In example embodiments, when the conductive post 160 and the first photoresist pattern 341 are ground using CMP, CMP conditions, e.g., pressure and rotating speed of a polishing head and the kind of slurry, may be controlled such that the planarized surface of the conductive post 160 is not too rough.

Referring to FIG. 8I, a second photoresist pattern 343 is formed on the top surface of the first photoresist pattern 341, which has been planarized. The second photoresist pattern 343 may include an opening 344 that exposes the top surface of the conductive post 160.

For example, the opening 344 of the second photoresist pattern 343 may have the same horizontal width as the top surface of the conductive post 160 and entirely expose the top surface of the conductive post 160. In example embodiments, the opening 344 of the second photoresist pattern 343 may have a different horizontal width than the top surface of the conductive post 160.

Referring to FIGS. 8J and 8I, a sacrificial layer 345 is formed in the opening 344 of the second photoresist pattern 343. The sacrificial layer 345 may cover the top surface of the conductive post 160, which is exposed through the opening 344 of the second photoresist pattern 343. In example embodiments, the sacrificial layer 345 may include an organic film, e.g., organic solderability preservative (OSP), but is not limited thereto. For example, the sacrificial layer 345 may include an insulating material. For example, the sacrificial layer 345 may include at least one selected from silicon oxide, silicon nitride, and silicon carbide.

For example, when the opening 344 of the second photoresist pattern 343 has the same horizontal width as the top surface of the conductive post 160, the sacrificial layer 345 may have the same horizontal width as the top surface of the conductive post 160.

Referring to FIGS. 8K and 8J, the first photoresist pattern 341 and the second photoresist pattern 343 are removed. For example, the first photoresist pattern 341 and the second photoresist pattern 343 may be removed using a strip process.

Referring to FIG. 8L, the semiconductor chip 200 is attached to the redistribution structure 101. The semiconductor chip 200 may be attached to the redistribution structure 101 such that the chip pad 220 faces the redistribution structure 101. The chip pad 220 of the semiconductor chip 200 may be connected to the third conductive line pattern 141 of the third redistribution pattern 140 through the chip connector 230.

After the semiconductor chip 200 is attached to the redistribution structure 101, the underfill material layer 240 is formed to fill the space between the semiconductor chip 200 and the redistribution structure 101. The underfill material layer 240 may surround the chip connector 230. For example, the underfill material layer 240 may be formed using a capillary underfill process after the semiconductor chip 200 is attached to the redistribution structure 101. In example embodiments, the underfill material layer 240 may be formed by attaching a non-conductive film to the chip pad 220 of the semiconductor chip 200 and attaching the semiconductor chip 200 to the redistribution structure 101.

Referring to FIG. 8M, after the underfill material layer 240 is formed, the molding layer 250 is formed to mold the semiconductor chip 200. The molding layer 250 may cover the semiconductor chip 200, the conductive post 160, and the sacrificial layer 345. The molding layer 250 may cover the side and top surfaces of the semiconductor chip 200 and the side and top surfaces of the sacrificial layer 345.

Referring to FIGS. 8N and 8M, a polishing process, e.g., CMP, may be performed on the molding layer 250 and the sacrificial layer 345 such that a planarized surface is obtained throughout the top surface of the sacrificial layer 345. As a result of the polishing process, the top surface of the sacrificial layer 345 may be exposed and may be coplanar with the top surface of the molding layer 250. In example embodiments, to grind the molding layer 250, which has relatively high rigidity, using CMP, the CMP may be performed under relatively high pressure and rotating speed of a polishing head.

The polishing process may be performed so that the sacrificial layer 345 is exposed. For example, the polishing process may be performed to remove a portion of the sacrificial layer 345 but not to remove another portion of the sacrificial layer 345 such that the top surface of the conductive post 160 is not exposed.

In example embodiments, the polishing process may be performed so that the top surface of the semiconductor chip 200 is exposed. In this case, the top surface of the semiconductor chip 200, the top surface of the molding layer 250, and the top surface of the sacrificial layer 345 may be coplanar with one another. In example embodiments, the polishing process may be performed to remove a portion of the molding layer 250 such that the top surface of the sacrificial layer 345 is exposed and the top surface of the semiconductor chip 200 is not exposed.

Referring to FIGS. 8O and 8N, the sacrificial layer 345 may be removed to expose the top surface of the conductive post 160. As a result of removing the sacrificial layer 345, an opening exposing the conductive post 160 may be formed in the molding layer 250. For example, the sacrificial layer 345 may be removed using wet cleaning.

As the sacrificial layer 345 is removed, the exposed top surface of the conductive post 160 is at a lower level than the top surface of the molding layer 250. The top surface of the conductive post 160 may have less roughness than the top surface of the molding layer 250 that has undergone the polishing process.

Referring to FIG. 8P, the first upper insulating layer 411 is formed on the semiconductor chip 200 and the molding layer 250. To form the first upper insulating layer 411, an insulating material film may be formed to cover the top surface of the molding layer 250 and the top surface of the semiconductor chip 200 and to fill the recess 257 (see FIG. 2) of the molding layer 250 and then partially removed by performing exposure and development such that a via opening exposing a portion of the top surface of the conductive post 160 may be formed.

To form the via opening of the first upper insulating layer 411, for example, RIE or laser drilling may be performed. The via opening of the first upper insulating layer 411 may have a shape, of which the horizontal width decreases toward the top surface of the conductive post 160.

After the first upper insulating layer 411 is formed, the first upper redistribution pattern 420 is formed. In detail, a seed metal film is formed on the top surface of the first upper insulating layer 411, the inner wall of the first upper insulating layer 411 defining the via opening of the first upper insulating layer 411, and the portion of the top surface of the conductive post 160 exposed through the via opening of the first upper insulating layer 411. For example, the seed metal film may be formed using physical vapor deposition. After the seed metal film is formed, the first upper conductive line pattern 421 and the first upper conductive via pattern 423 are formed by forming a photoresist pattern including an opening and performing a plating process using the seed metal film as a seed. Thereafter, the photoresist pattern is removed, and a portion of the seed metal film, which is exposed by removing the photoresist pattern, is removed. As a result of removing the seed metal film, the first upper seed layer 425 may be formed between the top surface of the first upper insulating layer 411 and the first upper conductive line pattern 421, between the first upper conductive via pattern 423 and the inner wall of the first upper insulating layer 411, and between the first upper conductive via pattern 423 and the conductive post 160.

After the first upper redistribution pattern 420 is formed, the second upper insulating layer 413 may be formed using processes which are substantially the same as or similar to processes for forming the first upper insulating layer 411, and the second upper redistribution pattern 430 may be formed using processes which are substantially the same as or similar to processes for forming the first upper redistribution pattern 420. The first upper insulating layer 411, the first upper redistribution pattern 420, the second upper insulating layer 413, and the second upper redistribution pattern 430 may form the upper redistribution structure 401.

Referring to FIG. 8Q, the upper semiconductor chip 500 is attached to the upper redistribution structure 401. The upper semiconductor chip 500 may be attached to the upper redistribution structure 401 such that the chip pad 520 faces the upper redistribution structure 401. The chip pad 520 of the upper semiconductor chip 500 may be connected to the second upper conductive line pattern 431 of the second upper redistribution pattern 430 through the chip connector 530.

After the upper semiconductor chip 500 is attached to the upper redistribution structure 401, the underfill material layer 540 is formed to fill the space between the upper semiconductor chip 500 and the upper redistribution structure 401 and to surround the chip connector 530.

After the underfill material layer 540 is formed, the upper molding layer 550 is formed to mold the upper semiconductor chip 500. The upper molding layer 550 may cover the side surface of the upper semiconductor chip 500.

Referring to FIGS. 8R and 8Q, after the upper molding layer 550 is formed, the carrier substrate 310 is removed. For example, the carrier substrate 310, to which the release film 311 is attached, is separated from a resultant structure of FIG. 8Q. For example, to separate the carrier substrate 310, a laser beam or heat may be radiated to the release film 311.

After the carrier substrate 310 is separated, the cover layer 320 is removed such that the external electrode pad 150 is exposed. For example, the cover layer 320 may be removed using an etching process.

After the cover layer 320 is removed, the external connector 190 may be attached. The external connector 190 may include, for example, a solder ball or a bump.

Referring to FIG. 8S, after the external connector 190 is formed, the semiconductor package 10b of FIG. 4 may be completed by performing a singulation process in which a resultant structure of FIG. 8R is cut along a scribe lane SL.

If a conductive post is exposed by a CMP process during which the conductive post and a molding layer are ground together, the conductive post may be sheared or contamination may occur due to a CMP residue. However, according to embodiments of the inventive concept, the conductive post 160 is covered and protected by the sacrificial layer 345 (in FIG. 8J) during a CMP process, and accordingly, damage to the conductive post 160 and contamination by a CMP residue may be reduced or possibly prevented and the reliability of a semiconductor package may be increased.

In addition, since the top surface of the conductive post 160 is at a lower level than the top surface of the molding layer 250, the conductive post 160 may be used as an align key, and accordingly, the accuracy of align key recognition may be increased when the first upper redistribution pattern 420 (in FIG. 8P) is formed. Furthermore, the conductive post 160 is protected by the sacrificial layer 345 and is thus not deformed during the CMP and is used as an align key, and therefore, the accuracy of align key recognition may be increased when the first upper redistribution pattern 420 is formed. Since the accuracy of align key recognition is increased when the first upper redistribution pattern 420 is being formed using the conductive post 160 as an align key, the electric characteristics of a semiconductor package may not be degraded by misalign.

While the inventive concept has been particularly shown and described with reference to example embodiments thereof, it will be understood that various changes in form and details may be made therein without departing from the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package comprising:
   a semiconductor chip comprising a chip pad;
   a lower redistribution structure on the semiconductor chip, the lower redistribution structure comprising a lower redistribution insulating layer and a lower redistribution pattern that is electrically connected to the chip pad of the semiconductor chip, and the lower redistribution insulating layer comprising a top surface facing the semiconductor chip, wherein the semiconductor chip comprises a bottom surface facing the lower redistribution structure and a top surface opposite the bottom surface of the semiconductor chip;
   a molding layer extending on a side of the semiconductor chip and comprising a bottom surface facing the lower redistribution structure and a top surface opposite to the bottom surface of the molding layer, wherein the top surface of the molding layer and the top surface of the semiconductor chip are coplanar;
   an upper redistribution insulating layer contacting the top surface of the molding layer and the top surface of the semiconductor chip; and
   a conductive post in the molding layer, the conductive post comprising a bottom surface contacting the lower redistribution pattern and a top surface opposite to the bottom surface of the conductive post,
   wherein the top surface of the conductive post is spaced apart from the top surface of the lower redistribution insulating layer by a first distance, and the top surface of the molding layer is spaced apart from the top surface of the lower redistribution insulating layer by a second distance that is greater than the first distance,
   wherein a side surface of the molding layer comprises an upper portion that defines a recess above the top surface of the conductive post, and wherein a roughness of the top surface of the molding layer is greater than a roughness of the top surface of the conductive post.

2. The semiconductor package of claim 1, wherein a roughness of the upper portion of the side surface of the molding layer is less than the roughness of the top surface of the molding layer.

3. The semiconductor package of claim 2, wherein a width of the recess of the molding layer in a horizontal direction is equal to a width of the top surface of the conductive post in the horizontal direction.

4. The semiconductor package of claim 1, wherein an arithmetical average roughness of the top surface of the molding layer is about two to eight times an arithmetical average roughness of the top surface of the conductive post.

5. The semiconductor package of claim 1, wherein the chip pad of the semiconductor chip is on the bottom surface of the semiconductor chip, and
the bottom surface of the conductive post faces the top surface of the lower redistribution insulating layer.

6. The semiconductor package of claim 5, further comprising:
a chip connector between the chip pad of the semiconductor chip and a portion of the lower redistribution pattern that extends on the top surface of the lower redistribution insulating layer; and
an underfill material layer, wherein the chip connector is in the underfill material layer.

7. The semiconductor package of claim 1,
wherein the upper redistribution insulating layer contacts the upper portion of the side surface of the molding layer and the top surface of the conductive post, and
wherein the semiconductor package further comprises an upper redistribution pattern comprising a portion in the upper redistribution insulating layer and contacting the top surface of the conductive post.

8. The semiconductor package of claim 1, wherein a distance between the top surface of the conductive post and the top surface of the molding layer is about 1 µm to about 100 µm.

9. A semiconductor package comprising:
a lower redistribution structure comprising a lower redistribution insulating layer and a lower redistribution pattern;
a lower semiconductor chip on the lower redistribution structure and comprising a chip pad electrically connected to the lower redistribution pattern, wherein the lower semiconductor chip comprises a bottom surface facing the lower redistribution structure and a top surface opposite the bottom surface of the lower semiconductor chip, and the chip pad of the lower semiconductor chip is provided on the bottom surface of the lower semiconductor chip;
a conductive post on the lower redistribution insulating layer and electrically connected to the lower redistribution pattern, the lower redistribution insulating layer comprising a top surface facing the lower semiconductor chip and the conductive post, and the conductive post comprising a bottom surface facing the lower redistribution structure and a top surface opposite to the bottom surface of the conductive post;
a molding layer extending on a side surface of the lower semiconductor chip and a side surface of the conductive post and comprising a bottom surface facing the lower redistribution structure and a top surface that is opposite to the bottom surface of the molding layer, wherein the top surface of the conductive post is spaced apart from the top surface of the lower redistribution insulating layer by a first distance, and the top surface of the molding layer is spaced apart from the top surface of the lower redistribution insulating layer by a second distance that is greater than the first distance, and the top surface of the molding layer and the top surface of the lower semiconductor chip are coplanar; and
an upper redistribution structure on the molding layer and the lower semiconductor chip, the upper redistribution structure comprising an upper redistribution insulating layer and an upper redistribution pattern, the upper redistribution insulating layer contacting the top surface of the molding layer and the top surface of the lower semiconductor chip, and the upper redistribution pattern extending through a portion of the upper redistribution insulating layer and contacting the conductive post,
wherein a roughness of the top surface of the molding layer is greater than a roughness of the top surface of the conductive post, and,
wherein a first portion of the top surface of the conductive post is in contact with the upper redistribution pattern and a second portion of the top surface of the conductive post is in contact with the upper redistribution insulating layer.

10. The semiconductor package of claim 9, wherein a side surface of the molding layer comprises an upper portion not covered by the conductive post, and the upper portion of the side surface of the molding layer and the top surface of the conductive post define a recess, and
the upper redistribution insulating layer contacts the upper portion of the side surface of the molding layer.

11. The semiconductor package of claim 9, further comprising an upper semiconductor chip on the upper redistribution structure and electrically connected to the conductive post through the upper redistribution pattern.

12. The semiconductor package of claim 9, wherein the lower redistribution insulating layer comprises a plurality of insulating layers,
the lower redistribution pattern comprises a plurality of conductive line patterns respectively on the plurality of insulating layers and a plurality of conductive via patterns, each of the plurality of conductive via patterns extending through a respective one of the plurality of insulating layers and being electrically connected to a respective one of the plurality of conductive line patterns, and
each of the plurality of conductive via patterns leas a width that decreases as a distance from the lower semiconductor chip increases.

13. The semiconductor package of claim 9, wherein the upper redistribution pattern comprises an upper conductive via pattern in the upper redistribution insulating layer, and the upper conductive via pattern contacts the top surface of the conductive post, and
the upper conductive via pattern has a width that increases as a distance from the top surface of the conductive post increases.

14. The semiconductor package of claim 13, wherein the upper redistribution pattern further comprises an upper seed layer extending on a side surface of the upper conductive via pattern and between the upper conductive via pattern and the top surface of the conductive post.

15. The semiconductor package of claim 9, wherein an arithmetical average roughness of the top surface of the molding layer is about two to eight times an arithmetical average roughness of the top surface of the conductive post.

16. A semiconductor package comprising:
   a lower package comprising a lower semiconductor chip, a molding layer extending on a side surface of the lower semiconductor chip, a conductive post in the molding layer, and a lower redistribution pattern electrically connecting the lower semiconductor chip to the conductive post;
   an upper package on the lower package, the upper package comprising an upper semiconductor chip, wherein the conductive post comprises a top surface facing the upper package, and the lower semiconductor chip comprises a top surface facing the upper package; and
   an interpackage connector between the lower package and the upper package, the interpackage connector being in contact with the top surface of the conductive post,
   wherein the molding layer comprises a top surface facing the upper package, and the top surface of the conductive post is recessed toward the lower redistribution pattern with respect to the top surface of the molding layer, and the top surface of the molding layer and the top surface of the lower semiconductor chip are coplanar,
   a side surface of the molding layer comprises an upper portion that defines a recess on the top surface of the conductive post, and
   a roughness of the top surface of the molding layer is greater than a roughness of the top surface of the conductive post.

17. The semiconductor package of claim 16, wherein the upper portion of the side surface of the molding layer is not covered by the conductive post, and
   the interpackage connector extends on the upper portion of the side surface of the molding layer.

18. The semiconductor package of claim 17, wherein the molding layer comprises an epoxy molding compound, and the conductive post comprises copper.

19. The semiconductor package of claim 18, wherein an arithmetical average roughness of the top surface of the molding layer is about two to eight times an arithmetical average roughness of the top surface of the conductive post.

* * * * *